(12) United States Patent
Oetzel

(10) Patent No.: US 12,121,987 B1
(45) Date of Patent: Oct. 22, 2024

(54) MULTIFUNCTIONAL SINTERING OR DIFFUSION SOLDERING DEVICE AND PRESSING TOOL

(71) Applicant: PINK GMBH THERMOSYSTEME, Wertheim (DE)

(72) Inventor: Christoph Oetzel, Freudenberg Boxtal (DE)

(73) Assignee: PINK GMBH THERMOSYSTEME, Wertheim (DE)

( * ) Notice: Subject to any disclaimer, the term of this patent is extended or adjusted under 35 U.S.C. 154(b) by 0 days.

(21) Appl. No.: 18/700,484

(22) PCT Filed: Oct. 7, 2022

(86) PCT No.: PCT/EP2022/077939
§ 371 (c)(1),
(2) Date: Apr. 11, 2024

(87) PCT Pub. No.: WO2023/061872
PCT Pub. Date: Apr. 20, 2023

(30) Foreign Application Priority Data

Oct. 14, 2021 (DE) .......................... 102021126716.1
Oct. 14, 2021 (DE) .......................... 202021105596.0

(51) Int. Cl.
| | |
|---|---|
| B23K 1/00 | (2006.01) |
| B23K 1/008 | (2006.01) |
| B23K 3/08 | (2006.01) |
| B23K 20/02 | (2006.01) |
| B23K 20/16 | (2006.01) |
| B23K 101/42 | (2006.01) |

(52) U.S. Cl.
CPC ............ *B23K 1/0016* (2013.01); *B23K 1/008* (2013.01); *B23K 3/087* (2013.01); *B23K 20/026* (2013.01); *B23K 20/16* (2013.01); *B23K 2101/42* (2018.08)

(58) Field of Classification Search
None
See application file for complete search history.

(56) References Cited

U.S. PATENT DOCUMENTS

| | | | |
|---|---|---|---|
| 4,448,149 A | 5/1984 | Brown, Jr. | |
| 2007/0296035 A1 | 12/2007 | George | |

(Continued)

FOREIGN PATENT DOCUMENTS

| | | |
|---|---|---|
| DE | 102016102162 A1 | 8/2017 |
| DE | 102017216545 A1 | 11/2018 |

(Continued)

*Primary Examiner* — Devang R Patel
(74) *Attorney, Agent, or Firm* — Dinsmore & Shohl LLP

(57) ABSTRACT

The present invention relates to a sintering device or diffusion soldering device for connecting components of at least one electronic assembly by means of pressure sintering, comprising an evacuatable process chamber in which an upper tool and a lower tool are arranged, between which the assembly is held and which are displaceable relative to one another in their distance apart to exert a press force, wherein the process chamber comprises a base body having on its upper side an access opening and a cover which is adjustable between a closed position in which the access opening is closed by the cover and an open position, wherein the upper tool is supported on the cover in the closed position of the cover at least during the exertion of the press force.

15 Claims, 13 Drawing Sheets

(56) References Cited

U.S. PATENT DOCUMENTS

Figure 1:
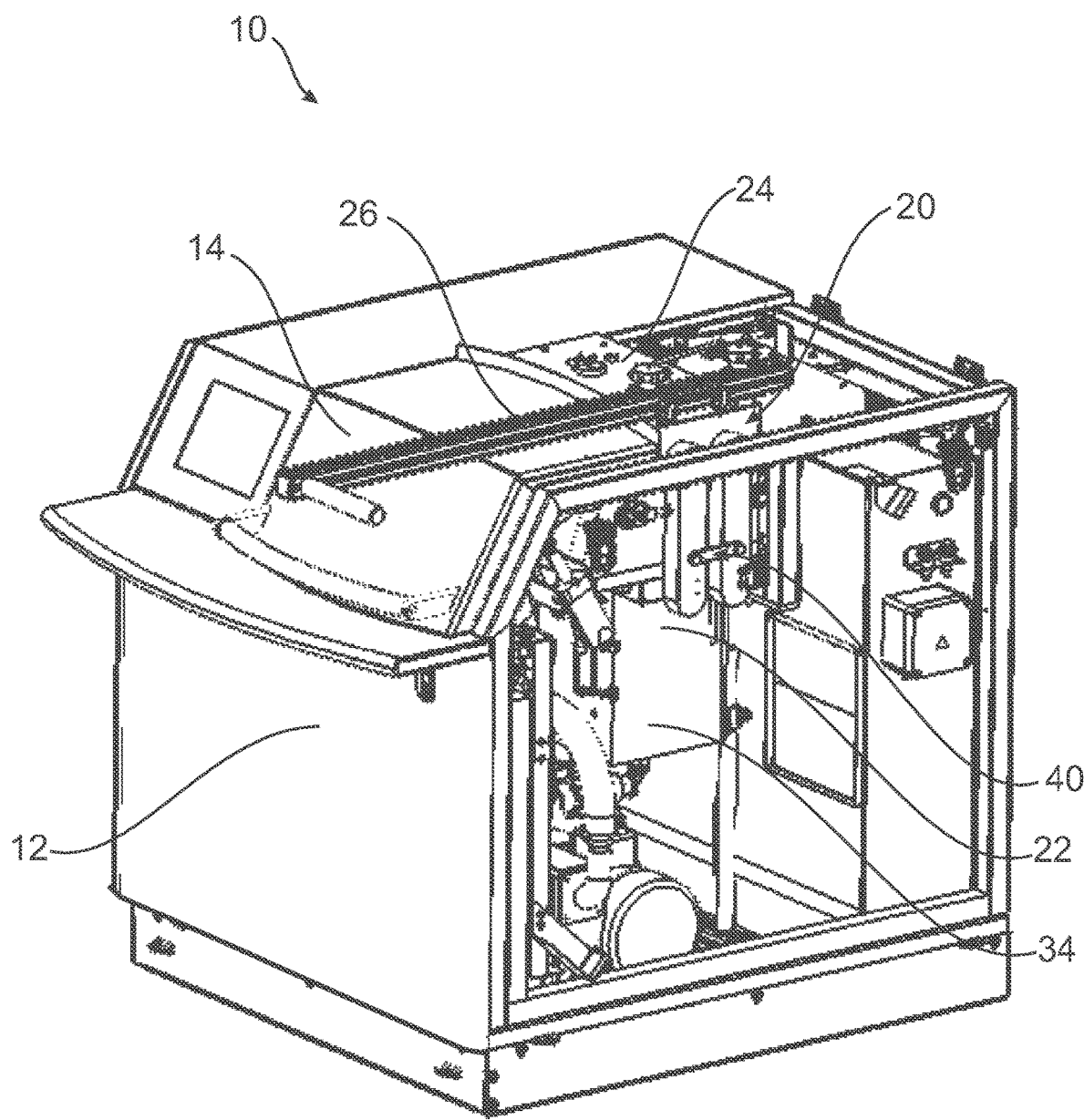

| | | |
|---|---|---|
| 2013/0133828 A1 | 5/2013 | Yoshitaka |
| 2017/0243851 A1 | 8/2017 | Rangelov |
| 2019/0080939 A1 | 3/2019 | Ding |
| 2022/0295643 A1* | 9/2022 | Huhler ................ H05K 3/3494 |
| 2023/0141430 A1* | 5/2023 | Endress ................ B23K 1/008 |
| | | 228/219 |
| 2023/0147525 A1* | 5/2023 | Diehm ................ B23K 1/012 |
| | | 228/219 |
| 2023/0191518 A1* | 6/2023 | Krebs ................ B23K 26/703 |
| | | 228/179.1 |

FOREIGN PATENT DOCUMENTS

| | | | |
|---|---|---|---|
| DE | 102019134410 A1 | 6/2021 | |
| EP | 3312877 A2 | 4/2018 | |
| NL | 2015895 B1 | 6/2017 | |
| WO | WO-2021069328 A1 * | 4/2021 | ....... H01L 21/67132 |

* cited by examiner

MULTIFUNCTIONAL SINTERING OR DIFFUSION SOLDERING DEVICE AND PRESSING TOOL

CROSS-REFERENCE TO RELATED APPLICATIONS

This application is a U.S. National Phase of International Patent Application No. PCT/EP2022/077939, entitled "MULTIFUNCTIONAL SINTERING OR DIFFUSION SOLDERING DEVICE AND PRESSING TOOL" and filed on Oct. 7, 2022, which claims priority to German Patent Application No. 10 2021 126 716.1 filed Oct. 14, 2021, and German Utility Model No. 20 2021 105 596.0 dated Oct. 14, 2021, the entire contents of all which are incorporated herein by reference in their respective entireties.

The present invention relates to a multifunctional diffusion soldering or sintering device for connecting components of at least one electronic assembly by means of diffusion soldering or pressure sintering, wherein the diffusion soldering or sintering device comprises an evacuatable process chamber in which an upper tool and a lower tool are arranged, between which the assembly is held and which are displaceable relative to one another in their distance apart to exert a press force.

PRIOR ART

Generic diffusion soldering or sintering devices are used to connect components of electronic assemblies mechanically, electrically and thermally conductively to one another. For example, a generic diffusion soldering or sintering device can be used to connect electronic semiconductor components, such as high-performance switching elements or semiconductor assemblies, and a basic body, for example a PCB, a heat sink or the like, to one another by means of diffusion soldering or pressure sintering. In diffusion soldering atoms of the solid basic material are mixed with atoms of the liquid solder using a press force. This results in an alloy zone which forms a substance-to-substance connection between the basic material and the solder. In pressure sintering, two or more components, in particular electronic components and substrates, can be connected to one another by means of a joining material in an electrically and/or thermally conductive manner, with the connecting joining material being sintered. A corresponding device and a method are known for example from WO 2014/135151 A2.

Generic diffusion soldering or sintering devices are frequently used in automatic soldering or sintering systems, in particular in automatic multi-chamber sintering systems. A similarly structured soldering device with a process chamber divided into several zones is described in EP 2 026 927 81.

The sintering of the electronic assemblies themselves is achieved by regulation of the temperature of the assemblies to be sintered and/or of their components and by the action of a press force imparted by the upper and lower tool. Thus the temperature required for connection and diffusion, for example in a variant of pressure sintering (low-temperature pressure sintering) with silver as the joining material, is regularly between approx. 130° C. and 250° C. to 300° C. The sintering operation needs a duration of around 5 to 10 minutes at a pressure of up to 30 MPa. Shorter times can be achieved by means of new sintering paste types.

To obtain during pressure sintering a layer as closed-pore as possible from the sintering material inserted between the components, in order to ensure a mechanically stable and in particular shear-resistant connection and also the required electrical and thermal conductivity, the joining layer is compacted by pressure before and during the diffusion process. Towards the end of the sintering operation, the pressure and the temperature are reduced.

Sintering devices with one or more sintering chambers and an associated method are described in DE 10 2014 114 093 B4.

DE 10 2017 216 545 A1 shows a device for creating a low-temperature pressure sintering connection for at least one electronic assembly.

DE 10 2019 134 410 A1 describes a method and a system for connecting electronic assemblies and/or for producing workpieces.

US 2007/0296035 A1 shows a device for connecting semiconductor structures.

US 2013/0133828 A1 describes a device for connecting a substrate to be processed and a support substrate.

One challenge is to apply the press force required for diffusion soldering or sintering to the assemblies in the most even manner possible, so that the components of the assemblies are not subjected to any local or temporary peak pressures. It is particularly demanding to prevent these local peak pressures when connecting assemblies in which several electronic components of differing height are arranged on one substrate or support.

Generic diffusion soldering or sintering devices often employ upper and/or lower tools which are adapted to the dimensions of the electronic assemblies to be manufactured or their components. For example, appropriate plungers of differing length can be fastened to the press tool.

As a rule, not only one type of assembly but different assembly types are produced with a certain diffusion soldering or sintering device. A change in the assembly type often also requires a change in the associated upper and/or lower tool. This in turn requires regular access to the process chamber to allow performance of the necessary resetting work. For other maintenance and/or cleaning work too, and in the case of faults, regular access to the process chamber is required. However, this type of access often involves a greater number of work steps, in which elements of the diffusion soldering or sintering device are removed and later put back in place. This leads to not inconsiderable downtimes for the diffusion soldering or sintering device, which can considerably disrupt the production sequence.

One object of the invention is therefore to create a diffusion soldering or sintering device affording simplified access to the process chamber.

DESCRIPTION OF THE INVENTION

The object is achieved by a diffusion soldering or sintering device having the features of claim 1. Advantageous embodiments of the sintering device are given in the dependent claims.

The present invention provides a diffusion soldering or sintering device for connecting components of at least one electronic assembly by means of diffusion soldering or pressure sintering, comprising an evacuatable process chamber in which an upper tool and a lower tool are arranged, between which the assembly is held and which are displaceable relative to one another in their distance apart to exert a press force, wherein the process chamber comprises a base body having on its upper side an access opening and a cover which is adjustable between a closed position in which the access opening is closed by the cover and an open position, wherein the upper tool is supported on the cover in the closed position of the cover at least during the exertion of the press force.

The diffusion soldering or sintering device can in particular be operated in adjustable atmospheric conditions, in particular in a vacuum. As a result, it can also be used multifunctionally for drying purposes in a vacuum or also at atmospheric pressure. Soldering or sintering pastes can preferably be dried with it, so that several functions such as drying, soldering or sintering can be used multifunctionally under adjustable atmospheric conditions. Purging using a cleaning fluid for corrosion prevention, e.g. with nitrogen (N2) and/or formic acid (HCOOH) is also possible.

By the arrangement of the access opening on the upper side of the process chamber or on its base body, easy access to the interior of the process chamber and in particular to the upper and/or lower tool is created when the cover is open. The forces arising during exertion of the press force or the corresponding counterforces are transmitted in the closed position to the cover, which thus assumes the function of a press yoke.

The access opening is preferably sealed gas-tightly in the closed position of the cover, for example by means of an all-round seal provided on the cover or on the base body.

This creates a diffusion soldering or sintering device which can be used for drying purposes in adjustable atmospheric conditions, in particular in a vacuum, and which is multifunctionally usable for soldering and sintering purposes, in particular for small runs or for development purposes.

Preferably, the upper tool is fastened to the cover such that the upper tool can be replaced particularly easily when the cover is open.

In accordance with a preferred embodiment, the cover is swivelably jointed to the base body about a tilting axis, wherein preferably an actuating arm set up to swivel the cover is fastened to the cover. The jointed connection of the cover to the base body ensures guidance of the cover during opening and closing. The actuating arm, which in particular can act as a lever arm, simplifies the opening and closing operation. The actuating arm may be fastened permanently to the cover such that the latter can be used directly without any resetting effort. Preferably, the actuating arm is fastened detachably to the cover and can be detached from the cover for the duration of its non-use and stowed in a space-saving manner for example at a storage area provided inside the diffusion soldering or sintering device. The actuating arm can be supported pneumatically, hydraulically or by means of a spring force during opening and closing of the cover. Alternatively or additionally, a motor-powered drive, for example by means of an electric motor or a hydraulic or pneumatic drive unit, can assist or perform opening or closing of the cover. It may be possible to dispense with an actuating arm here.

In accordance with a further preferred embodiment, the process chamber comprises a locking device movable between a locked position and an unlocked position, which in its locked position is configured to fix the cover in its closed position on the base body. The press force or a corresponding counterforce is transmitted from the cover to the base body by means of the locking device in the closed position, whereby the cover is held in the closed position against the press force or counterforce. In particular, in the locked position a joint by which the cover is swivelably jointed to the base body about a tilting axis can be relieved from load by the locking device, so that the press force or the corresponding counterforce is transmitted exclusively via the locking device between the cover and the base body. This allows a comparatively simple design to be used for the joint, such that this joint must only withstand the weight force of the cover without any additional load due to the press forces.

In accordance with a further preferred embodiment, the locking device has several swivelable locking arms which in the locked position are positively connected both to the cover and to the base body. The force is thus transmitted during the soldering or sintering operation substantially via the locking arms, with an inadvertent opening of the cover being prevented by the positive connection.

In accordance with a further preferred embodiment, each of the locking arms is fastened to the cover at its first end swivelably about a respective swivel axis and has at its second end a locking section which in the locked position is locked using a respective locking bolt associated with the locking arm and fastened to the base body. The engagement between the locking section and the locking bolt in the locked position can be released by swiveling the locking arms about the respective swivel axis in order to move the locking device from the locked position to the unlocked position. The locking arms in this embodiment are suspended swinging from the cover due to the force of gravity, whereby movement of the locking arms into the locked position is simplified and in particular can be combined with the closing operation of the cover, which can be assisted for example by suitably shaped insert chamfers at the second ends of the locking arms.

Preferably, the access opening, the cover in its closed position and the swivel axes of the locking arms extend in respective horizontal planes.

In accordance with a further preferred embodiment, the locking arms are arranged on two side surfaces of the cover opposite one another. This ensures an even force transmission between the cover and the base body, wherein forces causing deformation or bending of the cover can be considerably reduced. The cover preferably has a cuboidal shape, with an upper side and an underside parallel to the upper side, wherein the underside can have a sealing surface interacting with the base body, two first side surfaces extending parallel to one another and vertical to the upper side and underside, and two second side surfaces extending parallel to one another and vertical to the upper side and underside and vertical to the first side surfaces. Preferably, the aforementioned tilting axis of the cover runs parallel to the first side surfaces and the locking arms are arranged on the second side surfaces. This prevents access to the process chamber being impaired by the locking arms when the cover is open.

The sealing surface can be formed by a sealing ring, if necessary a sealing ring of round, square, rectangular or elliptical cross-section, which in the atmosphere state creates a distance between the cover and the base body due to which a locking closure of the cover is not possible. When a negative pressure is formed, preferably a vacuum, the sealing ring can be compressed between the cover and the base body by the negative pressure such that locking of the cover on the base body is possible by activating the locking mechanism.

A method for locking and unlocking of the cover can be as follows. During locking, the cover can first be pressed against the seal by means of an actuating arm until the locking arms automatically engage in the locking bolts. The position of the locking arms can be fixed in place by means of the blocking lever.

During unlocking, it is advantageous to first create a negative pressure or a vacuum in the process chamber, since the seal exerts a counterforce on the cover, and hence presses the locking arms against the locking bolt in the locked position. Due to the atmospheric pressure acting on the cover, the load on the locking arms against the locking bolt is relieved, since the cover is pressed further into the seal by the atmospheric pressure, such that the locking arms can be moved without force into an unlocking position by means of the release levers. By subsequent ending of the vacuum, the expanding seal permits gradual automatic swiveling of the cover towards an open position. The cover can then be swiveled relatively easily into the open position by means of the actuating arms.

In accordance with a further preferred embodiment, the locking device has precisely three locking arms, wherein a first and a second locking arm are arranged on the one side surface and a third locking arm on the other side surface. The aforementioned side surfaces are preferably the previously described second side surfaces.

In accordance with a further preferred embodiment, the swivel axes of the locking arms and the locking bolts associated with the locking arms are arranged such that the effective direction of a locking force, which is transmitted due to exertion of the press force between the cover and the base body via a respective locked locking arm, extends at least for the first and the second locking arm parallel to the effective direction of the press force, and for the third locking arm preferably obliquely to the effective direction of the press force. The locking forces transmitted via the first and the second locking arm thus act vertically to a main extent direction of the cover. This can also apply for the third locking arm, wherein however, preferably due to the oblique course of the locking force transmitted via the third locking arm in relation to the effective direction of the press force, this locking force has, in addition to a normal component extending parallel to the effective direction of the press force, a lateral component extending vertical to the effective direction of the press force and parallel to the main extent plane of the cover. The cover is pretensioned inside its main extent plane by this lateral component. Preferably, the angle created between the effective direction of the press force and the locking force transmitted via the third locking arm is only a few degrees, so that the lateral component is small in comparison to the press force.

In accordance with a further preferred embodiment, the first and the second locking arm are connected via a coupling rod such that the first and the second locking arm are synchronously movable between the locked position and the unlocked position. The locking arms here form an imaginary connecting line of their swivel axes and the coupling rods form a kind of parallelogram with variable angles, simplifying the locking and unlocking operation.

In accordance with a further preferred embodiment, a distribution of mass of the third locking arm and the position of the swivel axis of the third locking arm and of the locking bolt associated with the third locking arm are selected such that the third locking arm is held in its locked position solely or at least substantially by the effect of gravity when the cover is closed and in the absence of additional forces. The above distribution of mass can for example be asymmetrical in relation to an imaginary symmetry plane created between the swivel axis and a symmetry axis of the locking bolt parallel to the swivel axis when the locking arm is locked.

In accordance with a further preferred embodiment, at least one blocking lever preferably designed as a toggle lever and interacting with a respective associated locking arm is provided which is movable between a blocking position in which the blocking lever blocks the locking arm in its locked position against a movement and a release position in which the blocking lever releases the locking arm for a movement. Alternatively or additionally, at least one release lever preferably designed as toggle lever and interacting with a respective associated locking arm is provided, which is configured to move the locking arm from its locked position to its unlocked position. It is ensured by the blocking lever(s) that the locking arms are completely in the locked position and hence inadvertent unlocking due to the press force or to any movement forces acting on the locking arms is prevented. The locking arms can be released from their locked position by means of the release lever(s) and thus enable subsequent opening of the cover. The at least one blocking lever and/or the at least one release lever are preferably arranged on the base body.

To ensure that the locking device is always in its locked position during exertion of the press force, appropriate position sensors can be provided on the blocking levers, are connected to a control device of the diffusion soldering or sintering device, and prevent a drive provided to apply the press force from being activated in the event that the blocking lever(s) is/are not in the blocking position. Alternatively or additionally, position sensors can also be provided on the locking arms and/or on the locking bolts and are configured to detect whether the locking arms are in their locked position.

The present invention relates in a further aspect to a diffusion soldering or sintering device for connecting components of at least one electronic assembly by means of diffusion soldering or pressure sintering, in particular a diffusion soldering or sintering device according to one of the aforementioned embodiments preferred or in accordance with the invention, wherein the diffusion soldering or sintering device comprises an upper tool and a lower tool between which the assembly is held and which are displaceable relative to one another in their distance apart to exert a press force, wherein an elastic foil, preferably a graphite foil, is arranged between the press yoke and the upper tool and/or in the lower tool. The press yoke is a part provided to absorb the press force. Preferably, the press yoke can be formed by the cover of the previously described embodiments or can be formed as a separate part which can for example be arranged between the cover and the upper tool. The lower tool can be designed in several parts, in particular two parts, wherein the elastic foil is arranged between the two parts. The elastic foil can also be arranged underneath the lower tool towards a press device. The elastic foil is used to compensate for any non-parallelism between the upper tool and the press yoke and ensures a homogenization of the forces acting on the components. In particular, gradient curves of the press force over the surface of a press area are reduced.

In accordance with an advantageous embodiment of the diffusion soldering or sintering device stated above according to the further aspect, the lower tool has a fluid-filled pressure pad on a side facing the assembly. The pressure pad can also consist of silicone. The pressure pad causes, additionally to the elastic foil, a further homogenization of the press forces and in particular compensation for any height tolerances of the components to be connected.

The invention relates in a further aspect to a press tool for an upper tool or a lower tool of the diffusion soldering or sintering device according to one of the aforementioned embodiments preferred or in accordance with the invention, wherein the press tool comprises a rigid baseplate, a membrane part connected to the baseplate and formed by a flexible, preferably dish-shaped silicone membrane or a metal membrane preferably made from a steel alloy, and a pressure chamber preferably comprising a pressure pad filled with a fluid and arranged in a closed receiving area limited by the baseplate and the membrane part in the direction of the press surface. The pressure chamber can for example be filled with a fluid or can comprise a supporting structure or a pressure pad can be placed in it. Pressure pads have as a rule a flexible outer envelope which defines a volume for the fluid, for example silicone. The pressure pad can also consist entirely of silicone or another thermally resistant and pressure-homogenizing material. The outer envelopes are as a rule subject to heavy wear caused by adaptation to the contours of the components and also by fouling due to the components or to the joining material. To protect the pressure pad, conventional diffusion soldering or sintering systems often use foils, in particular of PTFE (polytetrafluoroethylene), arranged between the components to be connected and the pressure pad and which are removed after completion of the soldering or sintering operation. This involves however an additional method step which on the one hand prolongs the process time and on the other hand represents an additional source of faults. In the embodiment in accordance with the invention of the upper and lower tools, the metal membrane assumes on the one hand the function of such a protective foil and on the other hand the function of a holding device for the pressure pad. The pressure pad is protected from damage and fouling, wherein the flexibility of the metal membrane ensures a sufficient adaptation of the upper and/or lower tools to the components to be connected.

The provision of a closed receiving area for the pressure pad also reduces the requirements placed on the compressive strength of the pressure pad, since the pressure building up in the pressure pad during the pressing operation is completely absorbed via the baseplate and the membrane part, and excessive stretching of an outer envelope of the pressure pad is prevented.

In accordance with a preferred embodiment, the membrane part has an all-round rim section clamped between the baseplate and a clamping ring connected, preferably bolted, to the baseplate. A dependable connection between the membrane part and the baseplate is achieved by means of the clamping ring and also permits a replacement of the pressure pad or of the membrane part in case of a defect.

The membrane part can have an even thickness, but also areas of varying thickness. In particular, depending on an arrangement and/or surface structure of parts to be pressed, thickened and thinned membrane areas can be provided for adapting the flexibility of the membrane part in the part area. The membrane part can thus have, by means of a thickness variation, i.e. areas of thickened and thinned membrane surfaces, a stiffness structure adapted to a part arrangement, in particular of parts arranged in production goods carriers.

In an advantageous development, a sub-area of the pressure chamber of the press tool, in particular at least one sub-area of a pressure pad held in the pressure chamber, can be designed controllably fluid-fillable, in particular be gas-fillable. Preferably, the fluid filling can be controllable by means of at least one filler valve. Due to the fluid filling, in particular gas filling, of a sub-area of the pressure chamber, in particular a sub-area, a press force can be generated by a fluid filled into the pressure chamber, additionally or alternatively to the press force mechanically applied by the press. It is thus possible, for example by introducing atmosphere gas of the process chamber, if necessary also a purging gas such as nitrogen etc., into a sub-area of the pressure chamber when the pressure is reduced or a vacuum is created in the process chamber, that the pressure chamber expands through the membrane part. This generates a comparatively low yet in many cases sufficient pressure, for example for a bonding method, for low-pressure sintering with silver or copper, for diffusion soldering at for example up to 0.4 MPa, thermo-compression bonding at for example up to 0.1 MPa etc., on the components without a hydraulic press mechanically operating the press plungers. It is thus possible, solely by setting a defined process atmosphere in the process chamber and/or pressure chamber, for an exactly dosable press force to be applied to the component, which could not have been applied using a mechanical press by movement of the lower and upper tools relative to one another.

With this embodiment, a press tool can be provided inexpensively and easily with minor effort for an additional or alternative pressure application. This is because a required and controlled sintering pressure or diffusion soldering pressure or bonding pressure can be exerted on semiconductor elements using the gas pressure and the process atmosphere or vacuum in the process chamber generally required for the process, in order to compensate for height differences of the parts on the component.

To do so, no additional force measuring system or pressure measuring system is necessary, as a vacuum pressure sensor and a simple software area conversion is sufficient to obtain a required and set sintering pressure or diffusion soldering pressure or bonding pressure.

Since the vacuum chamber in a vacuum exerts pressure on the component(s) via the press tool, it can be continuously monitored during the process whether oxygen is penetrating into the vacuum chamber from the outside, since an unexpected chamber pressure increase can be detected immediately. This ensures that hot components, in particular copper surfaces, do not oxidize. Pressure monitoring of the components can be performed using a load cell which is for example comprised in the press drive. For example, jamming of a plunger can be detected.

In an advantageous development of the press tool, a multi-plunger unit with a plurality of press plungers guided in a guide frame can be arranged underneath the membrane part. This makes it possible to selectively exert pressure on individual parts of the components, and in particular to compensate for height differences. The press energy too can be reduced, since pressure is only built up in those areas in which it is needed. Sub-areas of the component can be protected from overloading.

The diffusion soldering or sintering device preferably has a cooling and/or heating device which is advantageously arranged at least in a lower tool of the press tool. The cooling and/or heating device can comprise an induction and/or convection heater, but also a radiation heater or a contact heater. Furthermore, fluid cooling, in particular by means of water, air or oil, can be provided.

DRAWING

Figure 2:
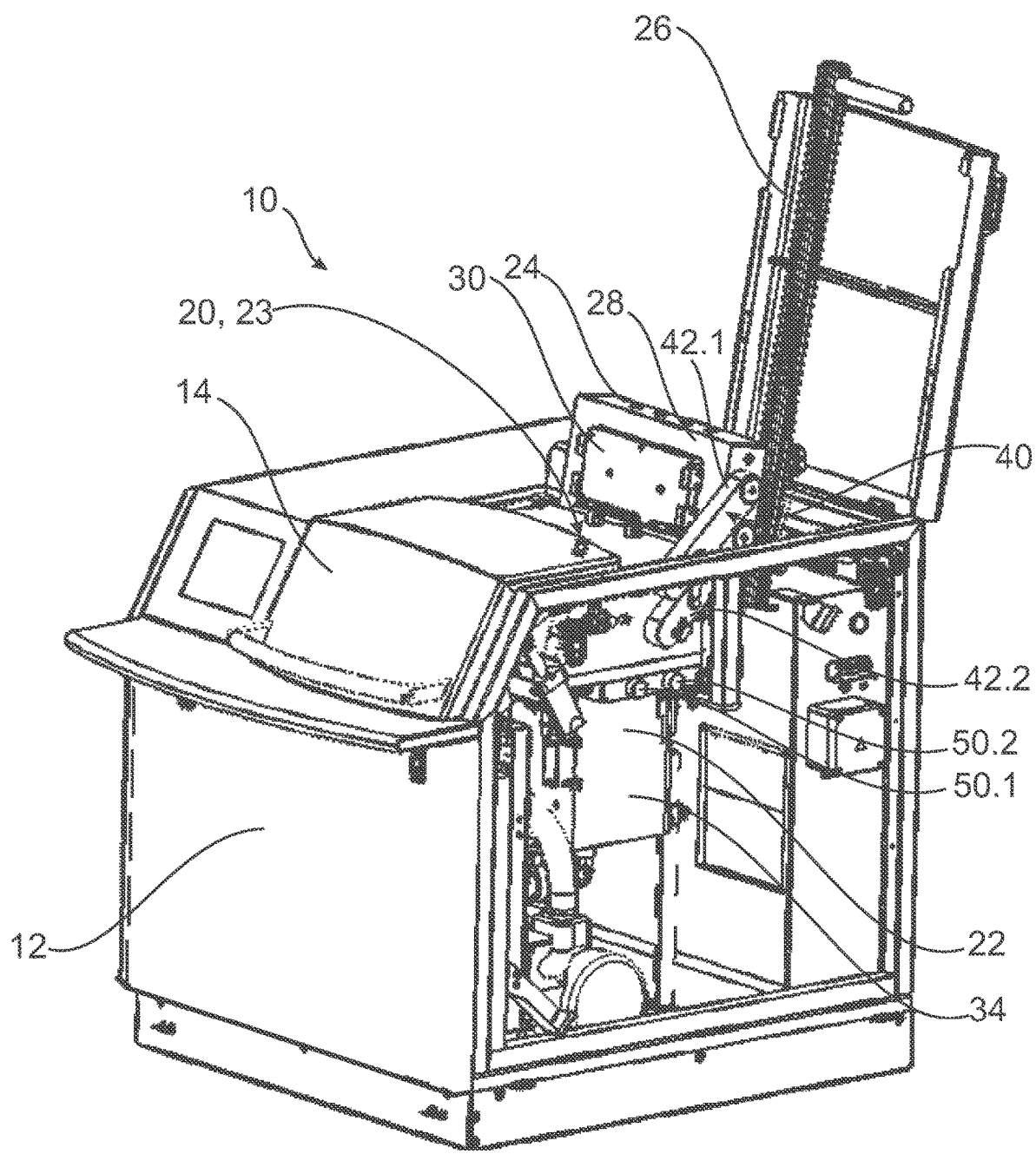

Further advantages emerge from the following drawing description. The drawing shows examples of the invention. The drawing, the description and the claims contain many features in combination. The person skilled in the art will also consider the features individually, and combine them into useful further combinations. In the figures:

FIGS. 1 and 2 show schematic perspective views of a diffusion soldering or sintering device in accordance with an example in different working positions.

Figure 3A:
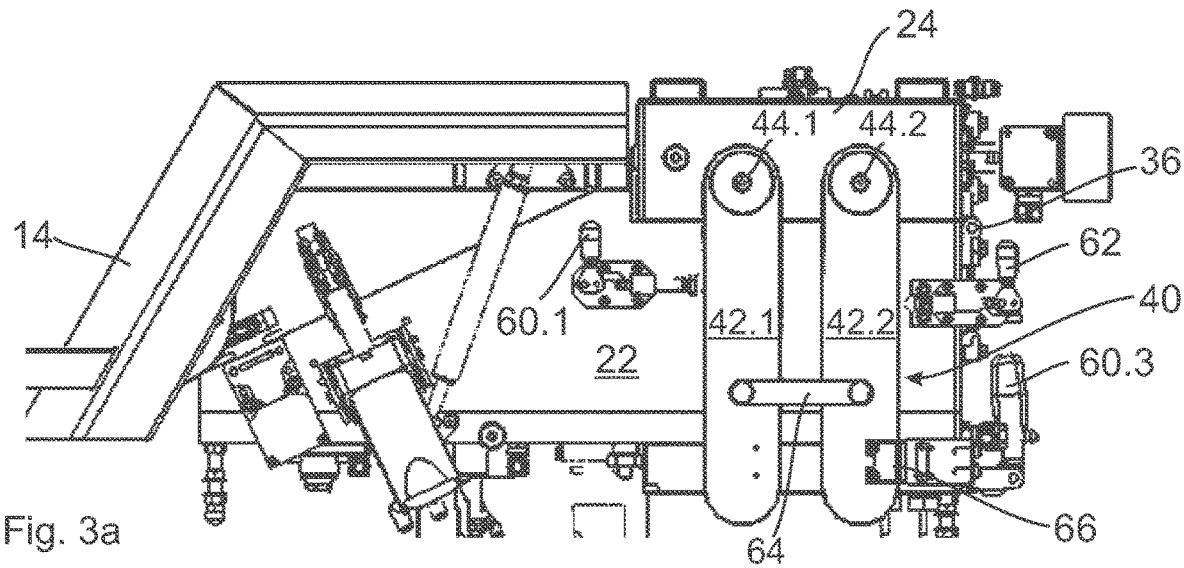
Figure 3B:
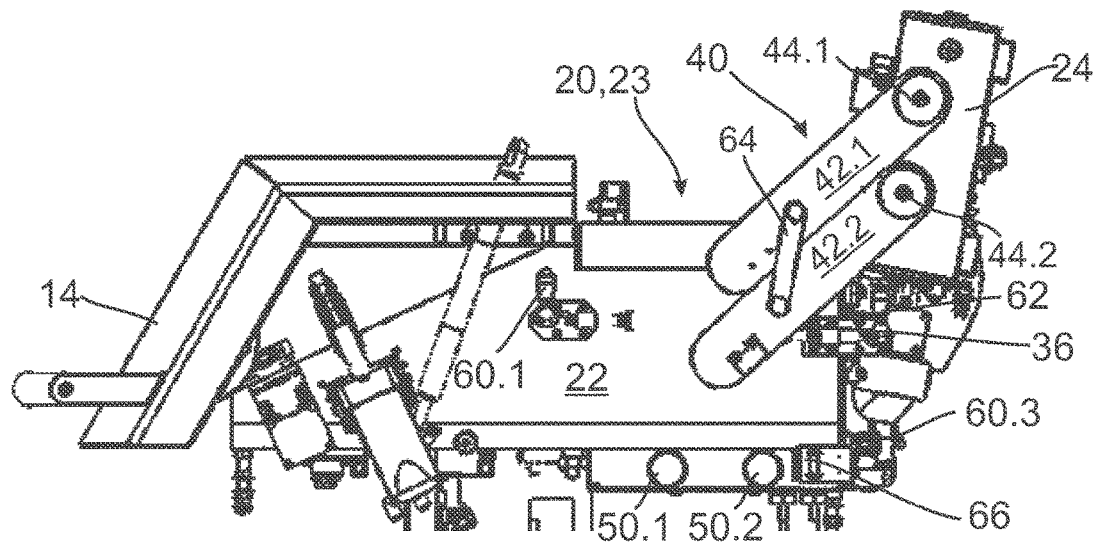
Figure 4:
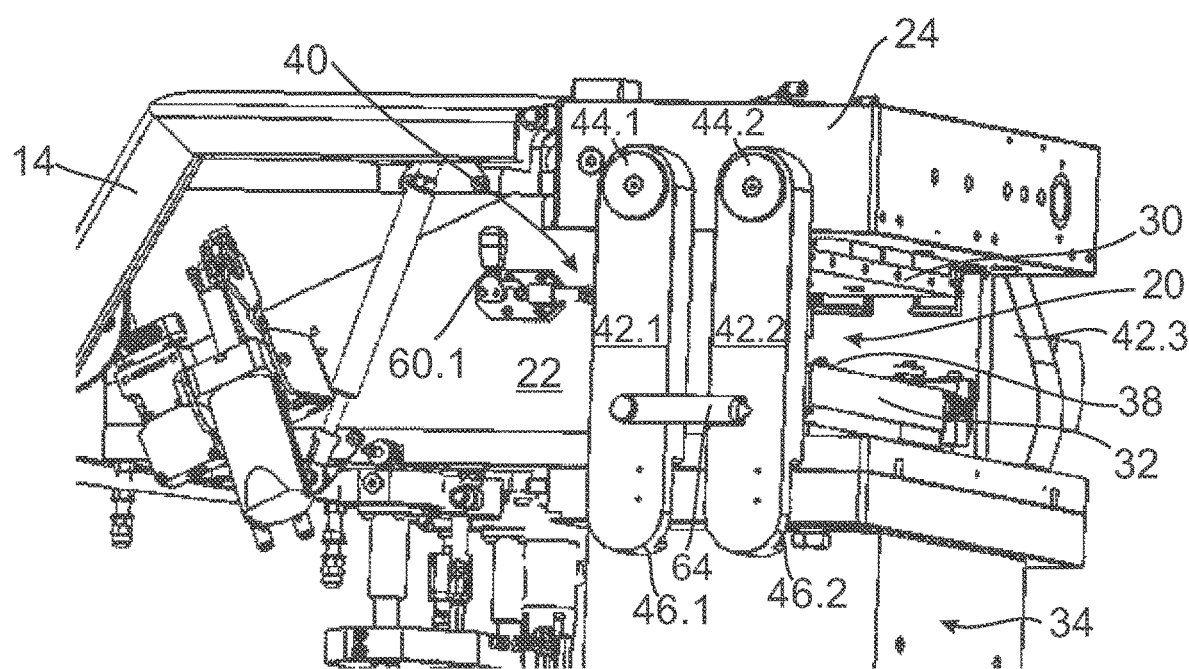
Figure 5:
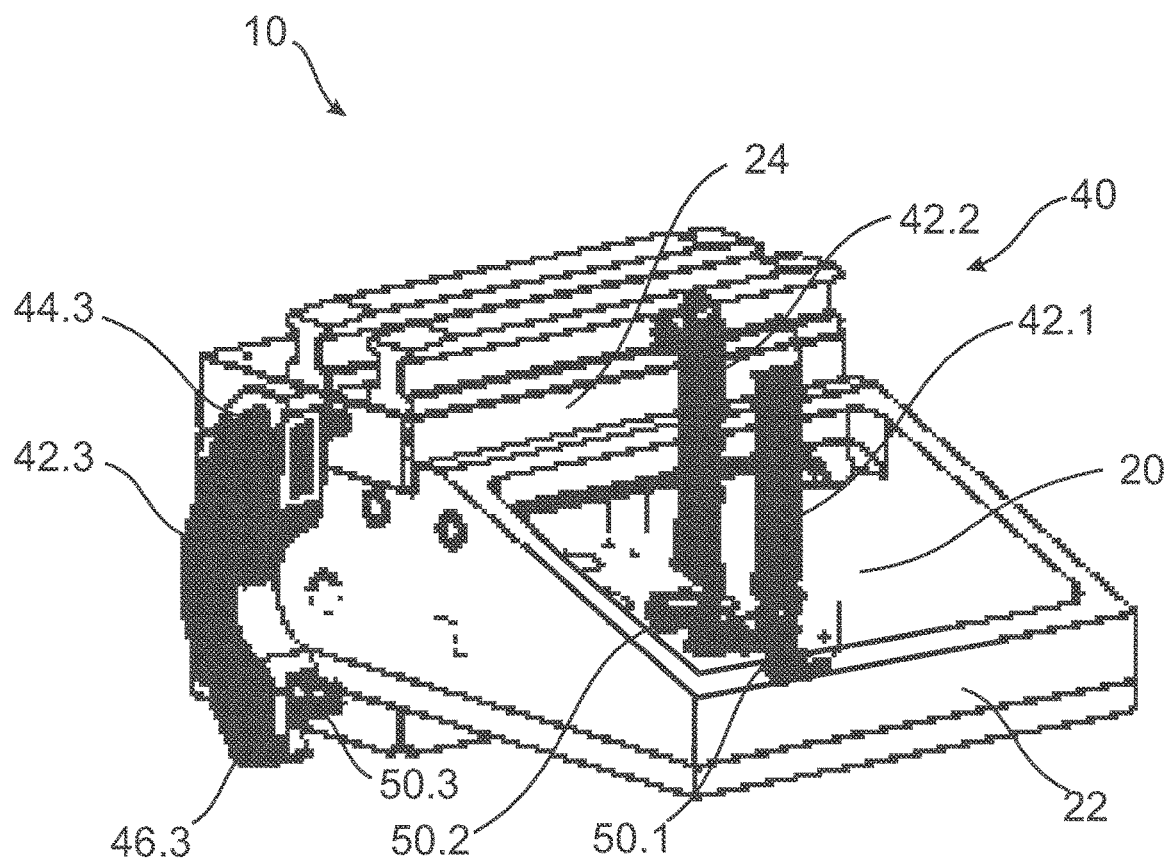
Figure 8:
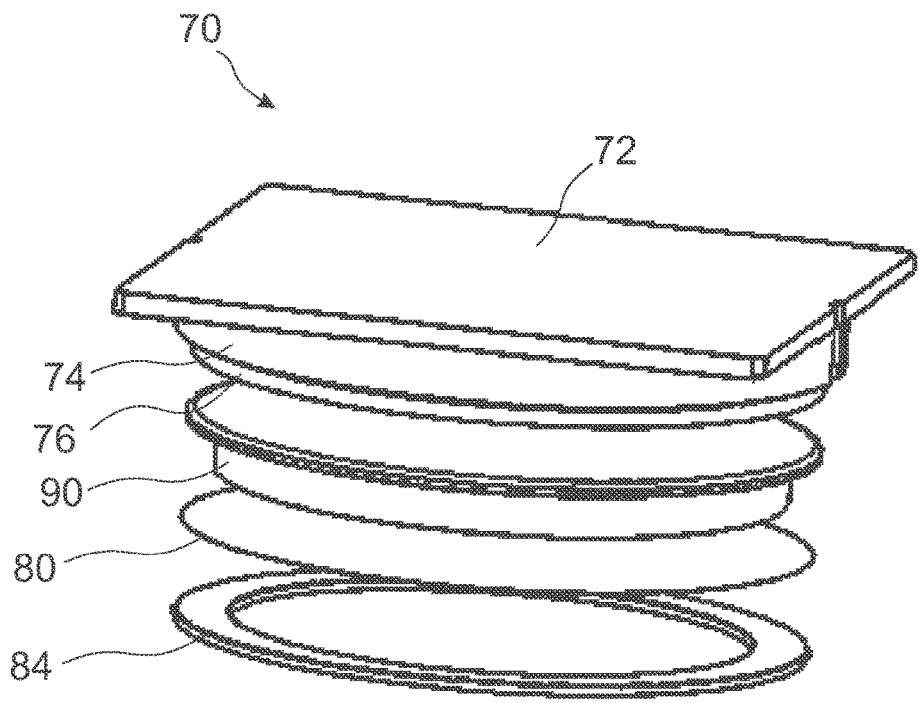
Figure 9A:
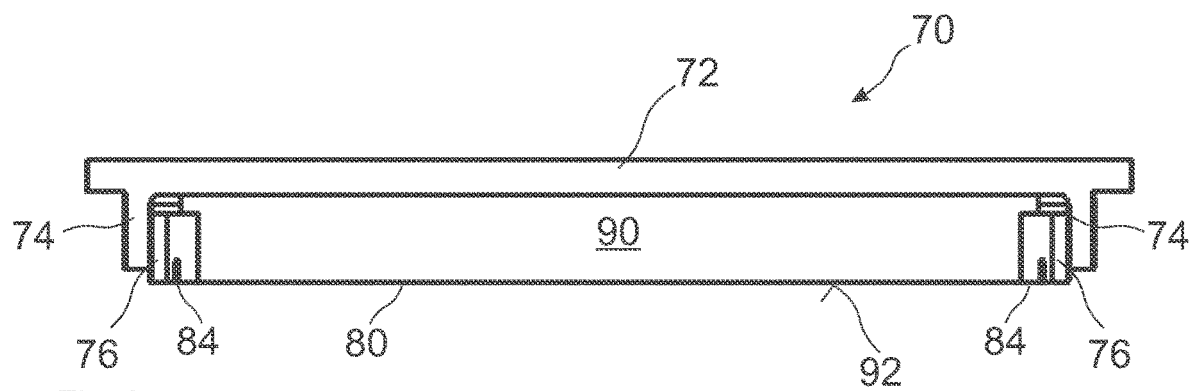
Figure 9B:
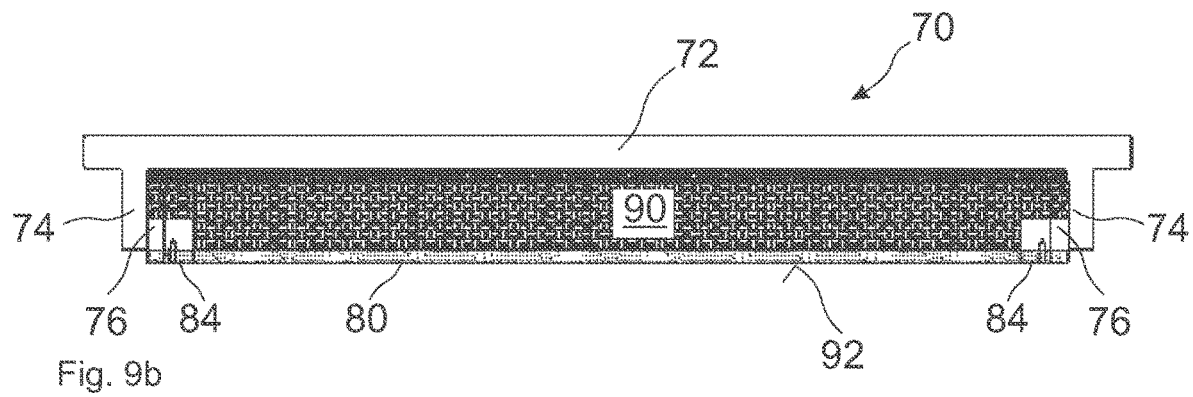

FIGS. 3a, 3b show a side view of the diffusion soldering or sintering device in FIGS. 1 and 2 in a closed position and in an open position, FIG. 4 a perspective view of the diffusion soldering or sintering device in FIGS. 1 to 3 in a partial sectional representation, FIG. 5 a perspective and semi-transparent view of the diffusion soldering or sintering device in FIGS. 1 to 4, FIGS. 6a, 6b a schematic side view and detailed view of a locking device of the diffusion soldering or sintering device in FIGS. 1 to 5;

FIG. 7 schematic representation of an opened and locked position of the cover of the diffusion soldering or sintering device in FIGS. 1 to 6;

FIG. 8 a perspective and exploded view of a press tool for a diffusion soldering or sintering device in accordance with an example:

FIGS. 9a, 9b sectional views of the press tool in FIG. 8, and

Figure 12A:
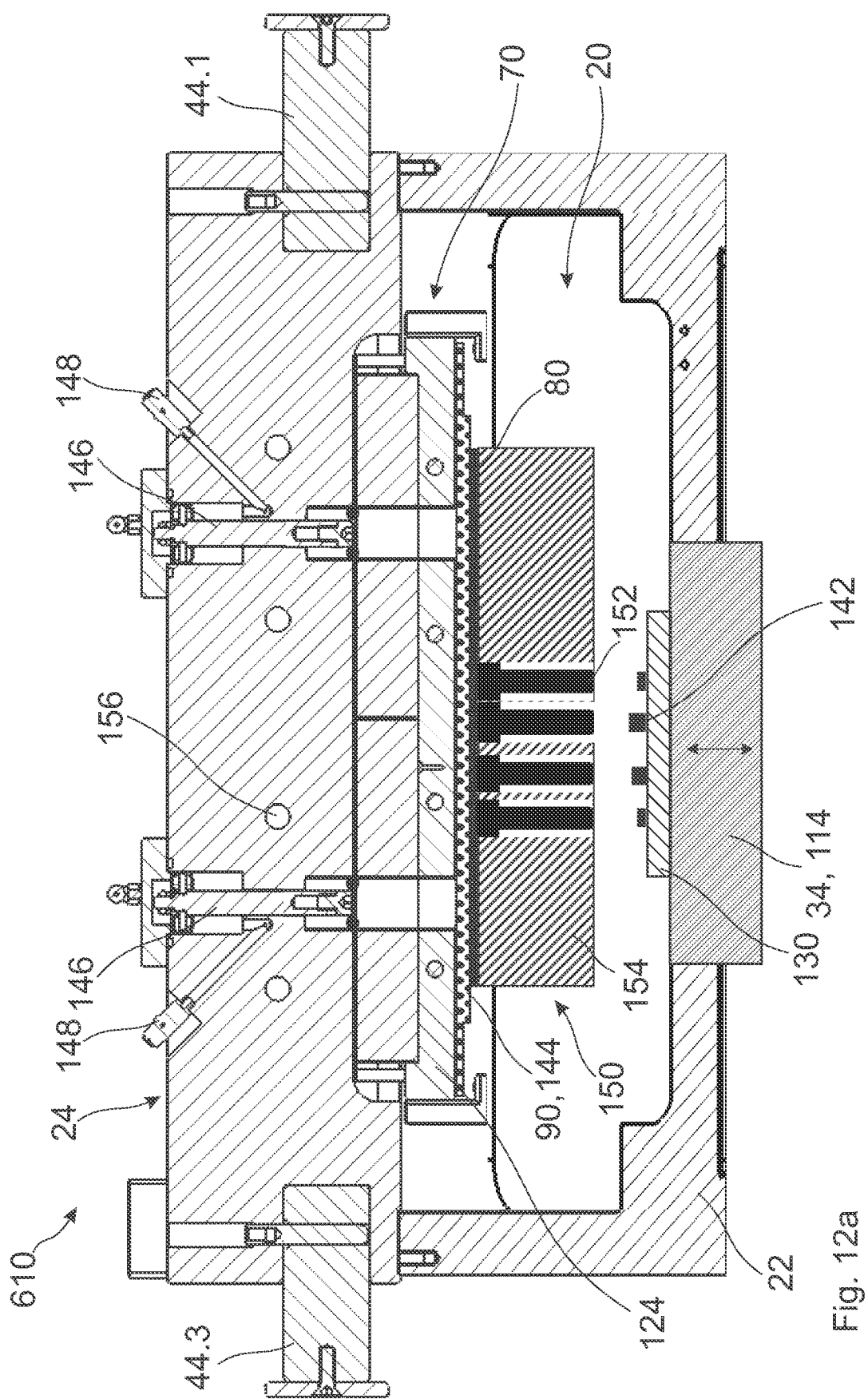
Figure 12B:
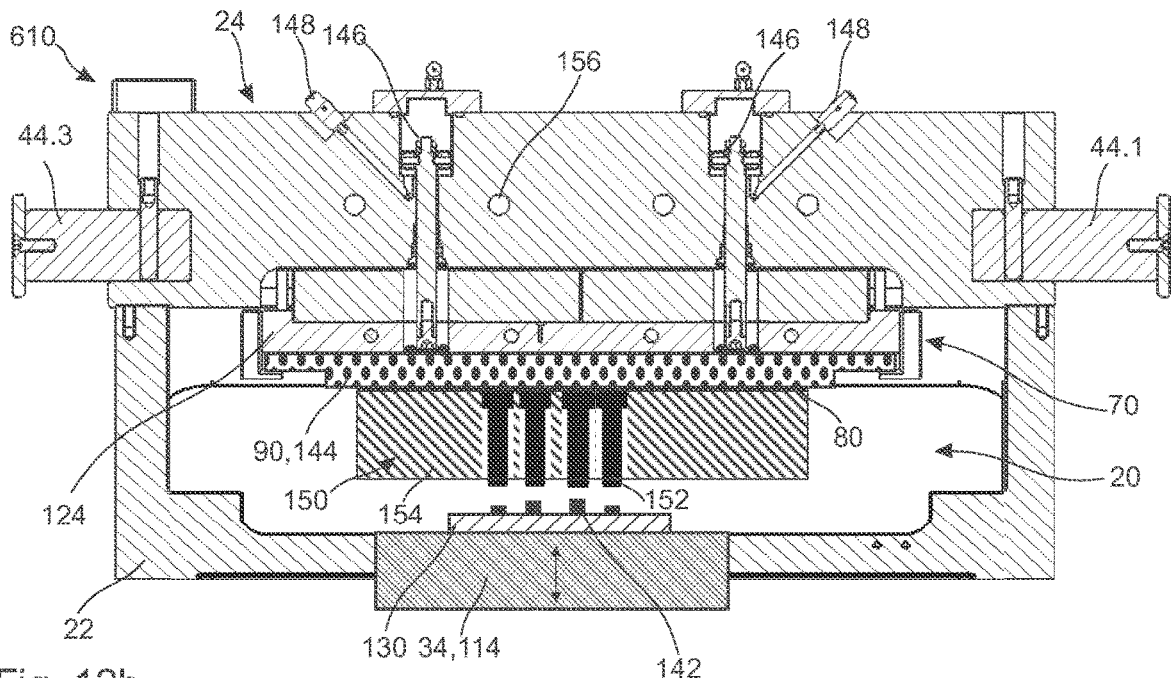
Figure 12C:
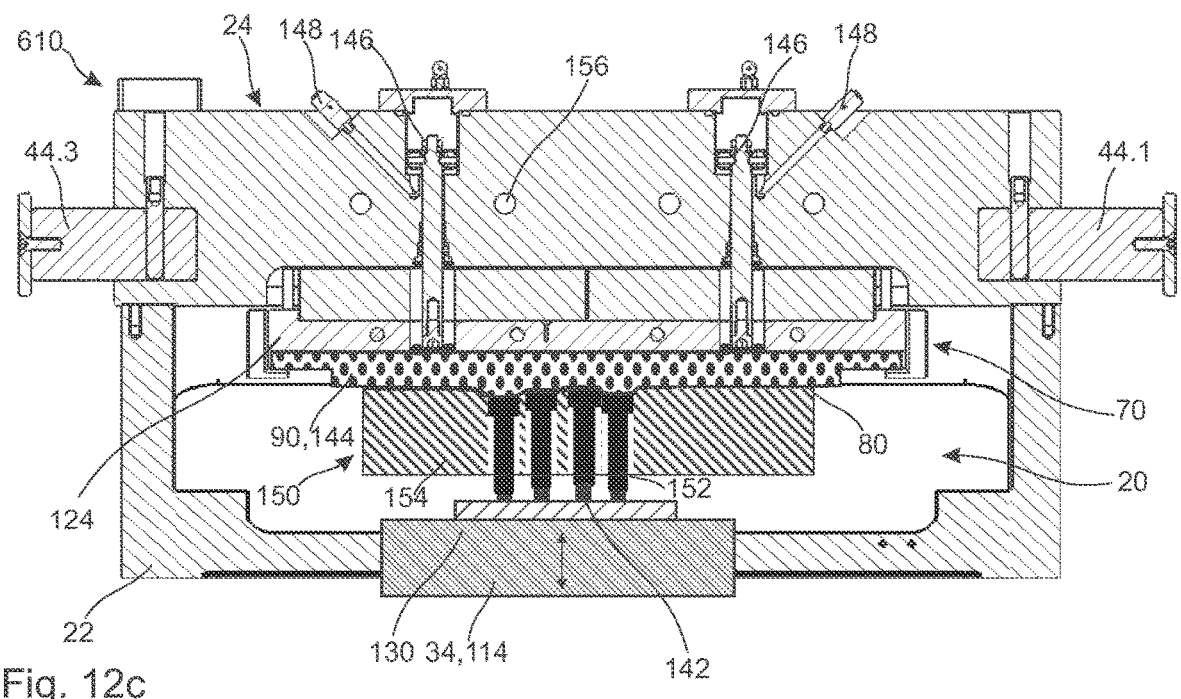

FIGS. 10, 11a-11d schematic side views of diffusion soldering or sintering devices in accordance with further examples:

FIGS. 12a-12c a further press tool in several method stages of a diffusion soldering or sintering device in accordance with an example;

The same reference numerals have been used in the following for identical or similar elements.

FIGS. 1 and 2 show a diffusion soldering or sintering device 10 in accordance with an example, which has a housing 12 enclosing an evacuatable process chamber 20 and various auxiliary units and auxiliary devices of the diffusion soldering or sintering device 10 not referred to in detail. The housing 12 has a swivelable lid 14 which in its open position affords further access to the interior of the housing 12 and in particular to the process chamber 20. The process chamber 20 can be purgeable with a cleaning fluid, for example nitrogen (N2) or formic acid. The pressure conditions of positive pressure, atmospheric pressure up to negative pressure and vacuum can be settable inside the process chamber 20. In particular, a soldering or sintering method in a vacuum or in an oxygen-free atmosphere prevents unwanted corrosion effects.

As additionally shown in particular in FIGS. 3a, 3b and 4 too, the process chamber 20 comprises a base body 22 having on its upper side an access opening 23, which is sealable by means of a cover 24 swivelable between a closed position (FIG. 1, FIG. 3a) and an open position (FIG. 2, FIG. 3b). The cover 24 has a generally cuboidal shape, wherein the upper side and underside running parallel to a main extent direction of the cover 24 extend in the closed position of the cover 24 in horizontal planes, while longitudinal and transverse side surfaces of the cover 24 extend in vertical planes. The cover 24 is jointed to the base body 22 using a joint 36 arranged on the rear longitudinal side surface.

The access opening 23 is bordered by a sealing surface interacting with an all-round sealing ring 28 provided on the underside of the cover 24. The sealing ring 28 is already lightly pressed by the weight force of the cover 24 against the sealing surface of the base body 22, so that the access opening 23 is already closed gas-tight at the beginning of an evacuation operation and no vacuum leak can occur. The cover 24 is, due to the building up of negative pressure which is for example less than 800 hPa, pressed more strongly against the base body 22, wherein the sealing ring 28 may slightly deform. If no negative pressure is applied, the sealing ring 28, preferably designed as an O-ring, can be stable and create a distance between cover 24 and base body 22 such that the cover 24 is not lockable. The joint 36 can have a certain play, such that pressing against the cover 24 or deformation of the sealing ring 28 by the joint 36 is not obstructed. By means of the negative pressure of 800 hPa or less, the cover 24 can already be in tight contact with the base body 22.

To actuate the cover 24, an actuating arm 26 acting as a lever arm is provided which is preferably detachably connected to the cover 24 and when not in use can be removed and stored inside the housing 12 (cf. FIGS. 1 and 2).

As can be seen in particular in FIGS. 3a, 3b and 5, the process chamber 20 can have a further access opening which permits additional access to the interior of the process chamber 20. This further access opening can be sealed by means of a further cover, for example using a lid 14, in particular using a gas-tight cover or an air lock, for example a sliding bulkhead or similar, which can be opened and closed using actuating and locking means not referred to in detail, or can be fixed to the base body 22 (cf. FIGS. 3a, 3b).

An upper tool 30 (FIGS. 2 and 4) projecting into the interior of the process chamber 20 is fastened to the cover 24. Furthermore, the diffusion soldering or sintering device 10 has a lower tool 32 arranged opposite the upper tool 30, wherein the electronic assembly components to be connected are arranged between the upper tool 30 and the lower tool 32 for performance of the diffusion soldering or sintering operation. The components to be connected can be placed into the process chamber 20 for example with the aid of a workpiece carrier 38 (FIG. 4).

To exert the press force, the lower tool 32 is mounted vertically movable and linked to a press drive 34 arranged underneath the process chamber 20 and connected to the base body 22.

During the pressing operation, the lower tool 32 is moved closer to the upper tool 30 by means of the drive 34, resulting in very high press forces acting on the upper tool 30 and hence also on the cover 24 such that opening of the cover 24 when a certain press force is exceeded cannot be prevented solely by the negative pressure prevailing in the process chamber 20.

Figure 6A:
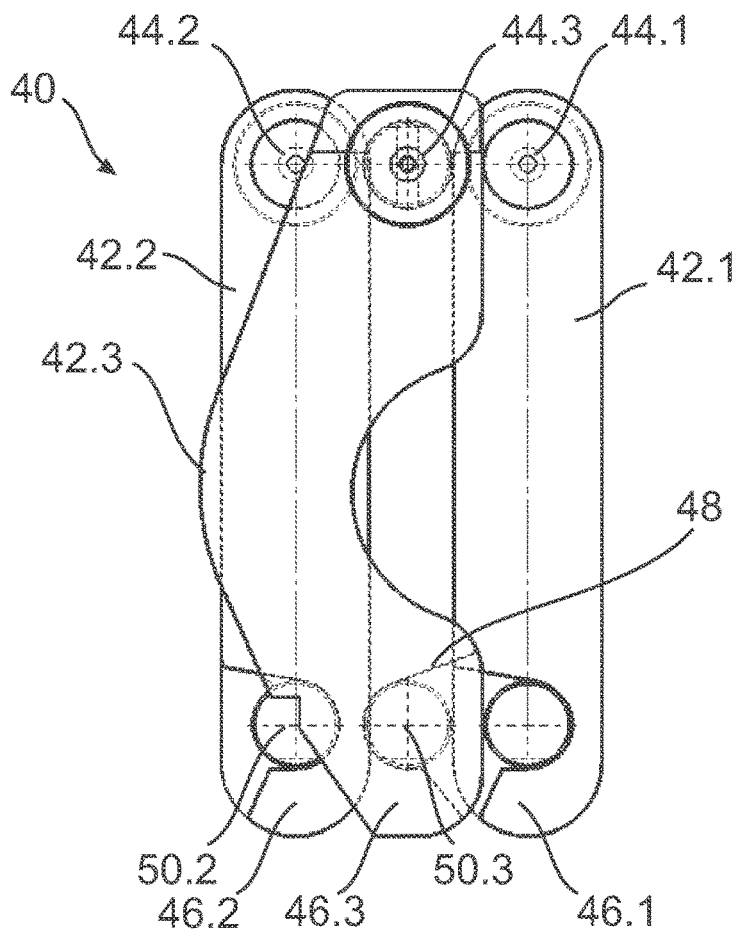
Figure 6B:
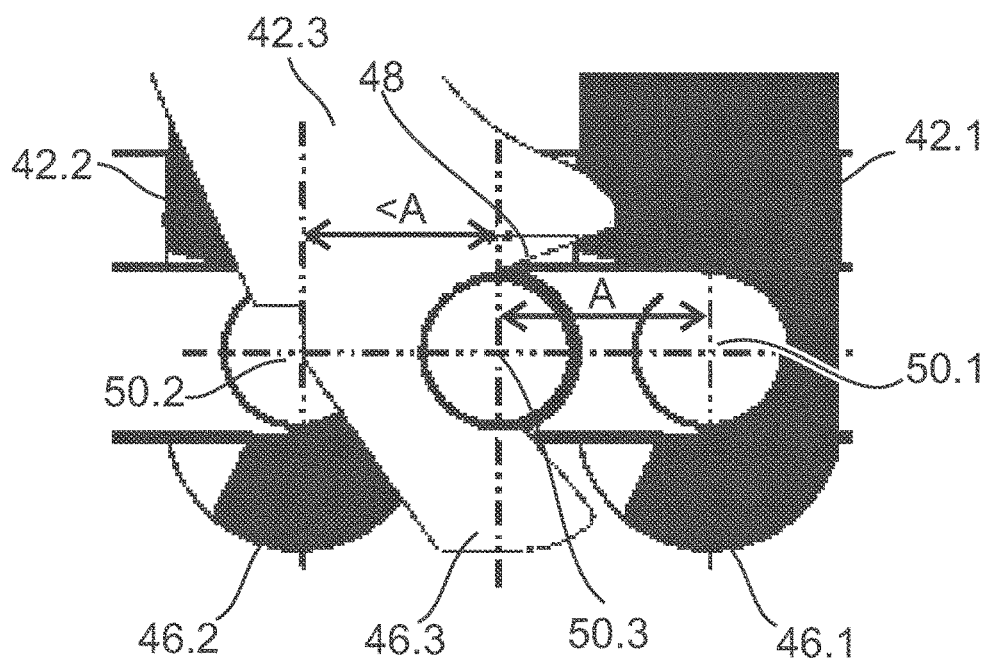

The diffusion soldering or sintering device 10 therefore has a locking device 40, explained in detail in FIGS. 5, 6a and 6b, which in its locked position fixes the cover 24 on the base body 22 in its closed position and comprises several swivelable locking arms 42.1-42.3 provided on the two transverse side surfaces of the cover 24. Each of the locking arms 42.1-42.3 is fastened with its first end to the cover 24 swivelably about a respective swivel axis 44.1-44.3 and has at its second end opposite the first end a respective locking section 46.1-46.3 which is locked in the locked position using a locking bolt 50.1-50.3 associated with the respective locking arm 42.1-42.3 and fastened to the base body 22. The association of the swivel axes 44.1-44.3, of the locking sections 46.1-46.3 and of the locking bolts 50.1-50.3 with the locking arms 42.1-42.3 is indicated by the last number behind the point in the reference numeral. In accordance with the example shown, the swivel axes 44.1-44.3 can extend inside a common plane running parallel to a main extent plane of the cover 24.

The locking arms 42.1-42.3 comprise, as shown in perspective in FIG. 5 and in a plan view in FIG. 6a, a first locking arm 42.1 and a second locking arm 42.3 which are arranged on one of the transverse side surfaces of the cover 24d, and a third locking arm 42.3 which is arranged on the transverse side surface opposite the aforementioned transverse side surface. The swivel axes 44.1, 44.2 of the first and second locking arms 42.1, 42.3 respectively and the symmetry axes of the associated locking bolts 50.1, 50.2 form the corners of an imaginary rectangle, as can be readily discerned in FIG. 6*a* in particular. The first and the second locking arms 42.1, 42.3 are linked by means of a joint-fastened coupling rod 64 (FIGS. 3*a*, 3*b* and 4), so that the locking arms 42.1, 42.2 can be swiveled synchronously between their locked and unlocked positions, wherein the locking arms 42.1, 42.2 perform here a parallelogram-like movement.

The swivel axis 44.3 of the third locking arm 42.3 is in the same plane as the swivel axes 44.1, 44.2, with the distance of the third swivel axis 44.3 to the first and second swivel axes 44.1, 44.2 being equal (cf. FIG. 6*b*). The symmetry axis of the third locking bolt 50.3 is in the same plane as the symmetry axes of the first and second locking bolts 50.1, 50.2, however with the distance A of the symmetry axis of the third locking bolt 50.3 to the symmetry axis of the second locking bolt 50.2 being smaller than the distance to the symmetry axis of the first locking bolt 50.1.

Due to the arrangement of precisely three locking arms 42.1-42.3 on the cover in conjunction with the symmetrical arrangement of their swivel axes 44.1-44.3, the most even locking possible of the cover 24 is assured while largely preventing torsion or distortion of the cover 24. It is thus ensured that the upper tool 30 also remains free of deformation or distortion, which may lead to negative effects on the evenness of the component to be connected thereon.

As can be readily discerned in FIG. 6*b* in particular, the swivel axis 44.3 of the third locking arm 42.3 and the symmetry axis of the locking bolt 50.3 seen in the lateral direction are however slightly offset from one another. While the effective direction of a locking force, which is transmitted due to the exertion of the press force between the cover 24 and the base body 22 via a respective locked locking arm 42.1-42.3, extends for the first and the second locking arms 42.1, 42.2 parallel to the effective direction of the press force generated by movement of the lower tool 32, this locking force extends for the third locking arm 42.3 obliquely to the effective direction of the press force. Hence the locking force transmitted via the third locking arm 42.3 has, in addition to a normal component parallel to the effective direction of the press force, a lateral component vertical to the effective direction of the press force and hence parallel to the main extent plane of the cover. As a result, the cover 24 inside its main extent plane is slightly braced, so that in particular its play in the jointed mountings of the locking arms 42.1-42.3 on the cover 24 in the locked position can be reduced, such that the cover 24 is in a precisely defined position during the pressing operation.

The lateral component of the press or locking force exerted via the third locking arm 42.3 does not however generate any torsion of the cover 24 about an axis extending in its main extent direction, so that the planarity of the cover 24 is not impaired.

As can be readily discerned in FIGS. 5 and 6*a*, the third locking arm 42.3 has a dished shape, whereby an asymmetrical distribution of the mass is achieved such that the third locking arm 42.3 is, when the cover 24 is closed and when additional forces are absent, moved under the effect of gravity into its locked position and is held in this locked position. This facilitates closing and locking of the cover 24 at the base body 22.

To ensure that the locking arms 42.1-42.3 are completely in their locked position and remain in this locked position even when the press force starts and cannot slip out inadvertently, respective blocking levers 60.1, 60.3 are provided on the sides of the base body 22 and can be designed as toggle levers and have an actuating element provided with a signal color, allowing the user to dependably recognize whether the locking arms 42.1-42.3 are actually in their locked position and blocked in this position by the respective blocking levers 60.1, 60.3. While the blocking lever 60.1 interacts with the locking arm 42.1 and, indirectly via the coupling rod 64, also with the locking arm 42.2, the blocking lever 60.3 arranged on the opposite side of the base body 22 interacts with the locking arm 42.3.

When the blocking lever 60.1 is in its release position (cf. FIG. 3*b*), the locking arms 42.1-42.3 can swiveled from their locked position into their unlocked position by means of a release lever 62 likewise designed as a toggle lever. A release lever of this type can also be omitted for the third locking arm 42.3, since unlocking is automatic here when the cover 24 is opened. The locking section 46.3 can for that purpose be moved for example by means of an extraction chamfer 48 and with the assistance of gravity from its locked position into the unlocked position and hence disengaged from the third locking bolt 50.3.

To ensure additional monitoring of the locked position of the locking arms 42.1-42.3, a locking sensor, which can be designed for example as an optical, magnetic, electrostatic or mechanical sensor, can be provided on one or more of the locking arms 42.1-42.3 and detects whether a respective locking arm 42.1-42.3 is engaged with the associated locking bolt 50.1-50.3. In the present example, such a locking sensor 66 is provided on the second locking arm 42.2 (FIGS. 3*a*, 3*b* and 4).

Figure 7A:
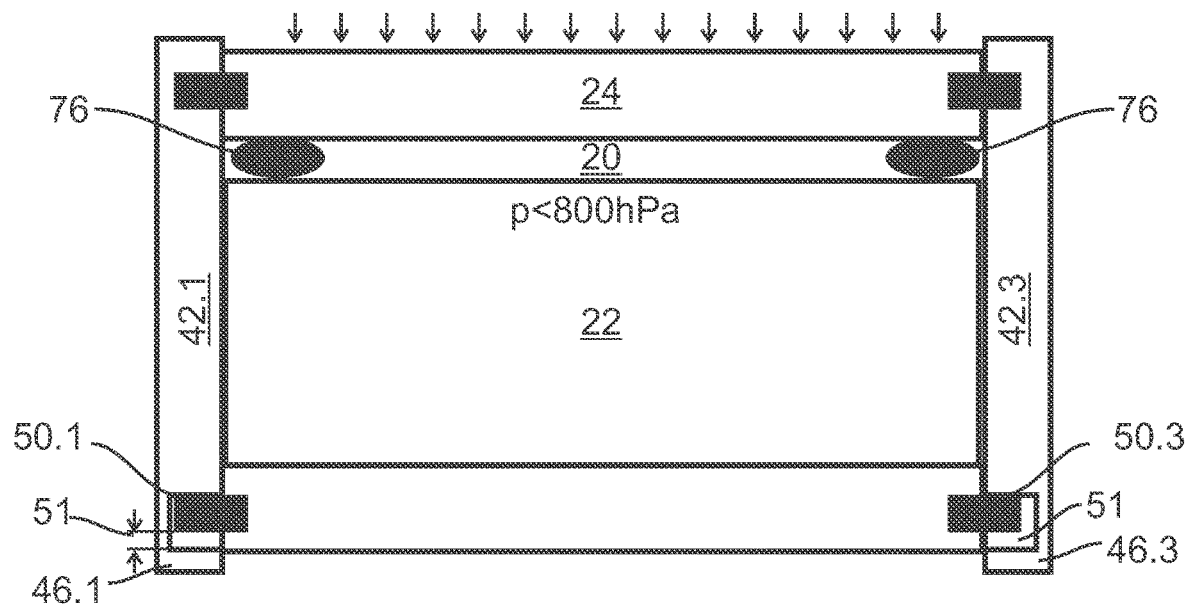
Figure 7B:
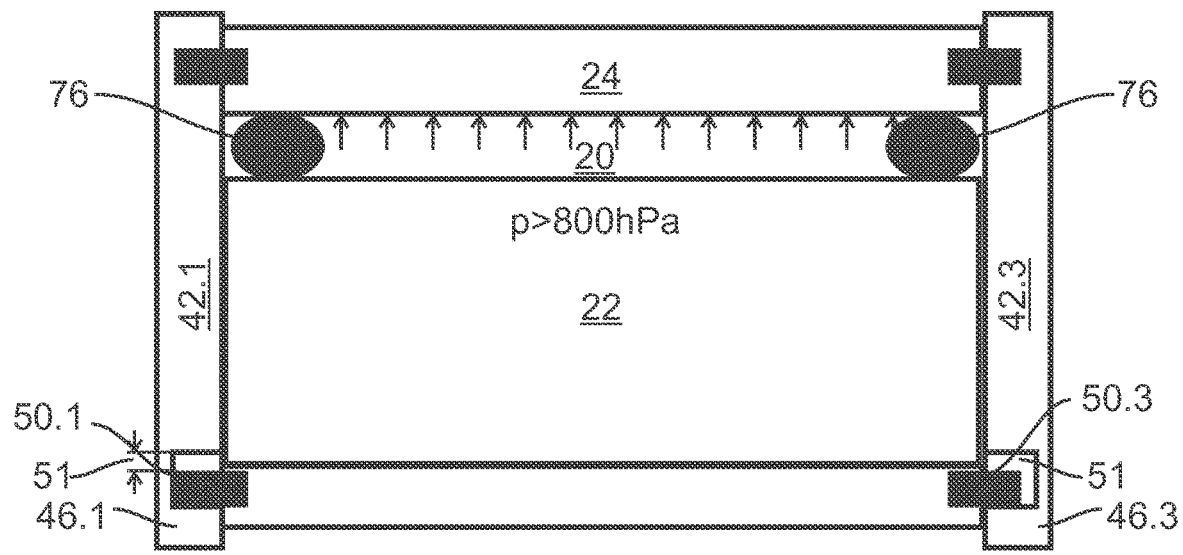

As shown in FIG. 7, opening and closing of the cover 24 can be assisted by a negative pressure of for example 800 hPa or less and by the sealing ring 76. It is thus possible, as shown in FIG. 7*b*, for the cover 24 firstly to be kept at a distance in the direction of the base body 22 by the sealing ring 76, which initially does not allow the locking arms 42.1-42.3 to assume the locked position. By evacuation of the vacuum chamber 20, the atmospheric pressure, indicated by arrows on the cover 24, can press the sealing ring 76 in the direction of the process chamber 20 such that the locking arms 42.1-42.3 are moved automatically into a locked position under the effect of gravity, see FIG. 7*a*. One or more locking sensors 66 monitor the assumption of the correct locked position. The position of the locking arms 42.1-42.3 can be locked by the blocking levers 60.1-60.3 such that opening of the cover is not possible in the pressureless state, since the sealing ring 76 presses the cover against the locking device 40. To permit the locked position, a play 51 is provided in at least one locking section 46.1-46.3 of at least one locking arm 42.1-42.3 for receiving a locking bolt 50.1-50.3.

In accordance with a further aspect of the invention, FIGS. 8 and 9*a* or 9*b* show a press tool 70 for a diffusion soldering or sintering device, in particular the diffusion soldering or sintering device 10 of the example described above. The press tool 70 can be designed both as an upper tool and as a lower tool and comprises a baseplate 72 and a cylindrical wall section 74 extending away from the baseplate 72. The square shape of the baseplate 72 in the example and the cylindrical shape of the wall section 74 are purely examples and they can each have diverging shapes.

A hollow space defined by the baseplate 72 and the wall section 74 is closed by a membrane part 80. The membrane part 80 can be made flat or dished, for example by deep-drawing from a metal membrane or metal foil, wherein a steel alloy, for example a chrome-nickel-steel alloy, is provided as the preferred material for the membrane part 80. The membrane part 80 borders the hollow space on its side facing away from the baseplate 72, in which for example a pressure pad 90 is receivable as the pressure chamber. Alternatively, a supporting structure, for example a mechanically soft metal, a fluid chamber or a silicone pad can also be received in the hollow space. The membrane part 80 can have an all-round rim section extending at the sides as far as the wall section 74 and which for example is clamped between the baseplate 72 and a clamping ring 84. The clamping ring 84 can be bolted to the baseplate 72, in particular fastened to the open section of the wall section 74, and can fasten the preferably dish-like rim section of the membrane part 80. Alternatively, the membrane part 80 can be fastened directly to the wall section 74. A sealing ring 76, which can interact with an inner circumferential surface of the wall section 74, can be placed in a circumferential groove arranged in the clamping ring 84.

The hollow space formed between the baseplate 72 and the membrane part 80 defines a receiving space closed on all sides for a pressure pad or a pressure chamber 90, see FIGS. 9a, 9b. This receiving space can form for example a pressure chamber 90 filled with a fluid, for example silicone or oil, see FIG. 9a, or a pressure pad 90 can be inserted, see FIG. 9b, wherein the pressure pad 90 can for example be an oil-filled pad or a silicone pad or the like. The pressure pad 90 can for example have threaded inserts, allowing the pressure pad 90 to be bolted to the baseplate 72.

The thickness of the membrane part 80 is selected such that the membrane part 80 in the area of a press surface 92 interacting with the electronic assembly components to be connected has a sufficient elasticity to deform by a suitable dimension and impart via the pressure pad 90 a compensation in pressure between adjacent components. The membrane part 80 can have a uniform thickness, but also areas of varying thickness. The membrane part 80 can thus be thickened or thinned in some areas, and hence have a structure corresponding to differing pressure area zones depending on the arrangement structure of components 130 to be pressed. The sintering tool 70 can have a total height von ca. 40 mm, wherein the size ratios shown in FIGS. 8 and 9 do not necessarily have to be true to scale. In particular, the thickness of the membrane part 80 can also be smaller than shown.

The sealing ring 76 can have a multi-layer structure, with the illustrations of the sealing ring 76 in FIGS. 8, 9a, 9b being simplified. It is generally conceivable to design the clamping ring 84 in several parts instead of with an inserted sealing ring groove.

Figure 10:
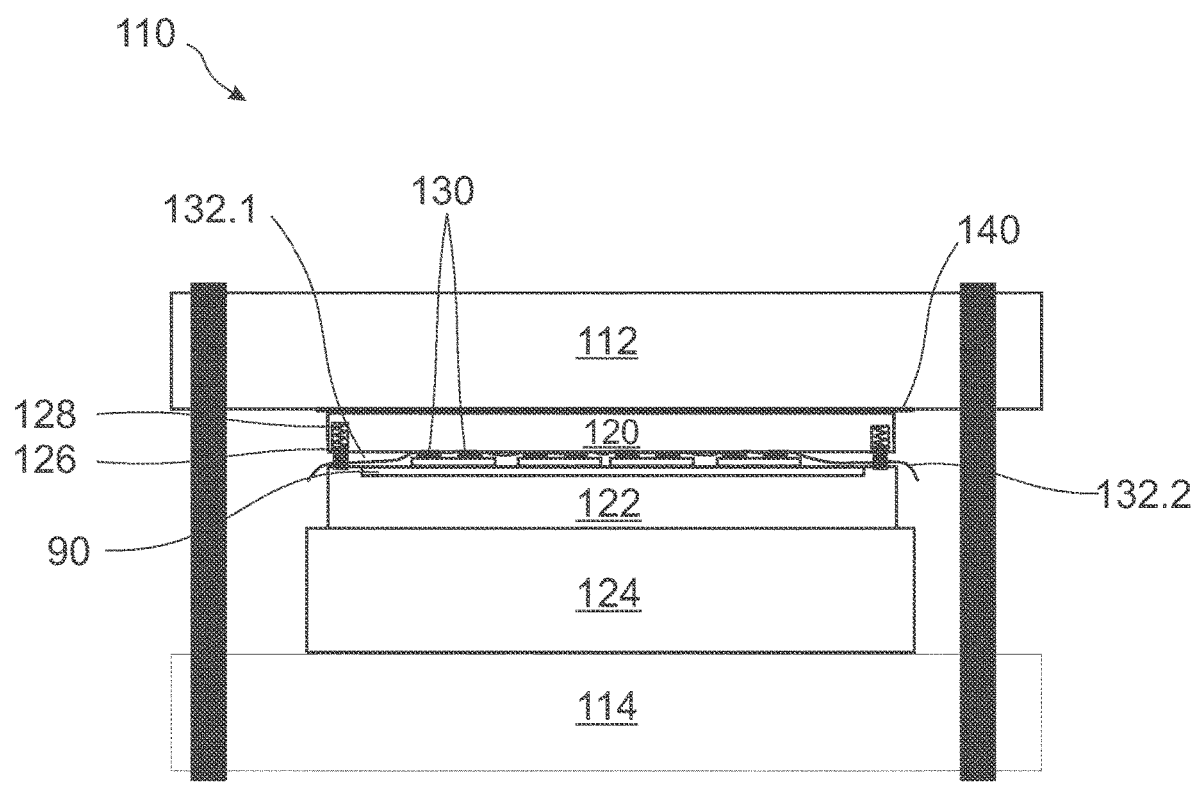

With reference to FIGS. 10 to 12, further diffusion soldering or sintering devices 110, 210, 310 are described, where the features described in this connection can both be realized in combination with the features of the previously described diffusion soldering or sintering device 10 in accordance with FIGS. 1 to 7 and used in other generically similar sintering devices.

The diffusion soldering or sintering device 110 shown schematically and not to scale in FIG. 10 comprises a press yoke 112 of an upper tool and a press plunger 114 of the lower tool provided underneath the press yoke, which are movable relative to one another by means of a drive in order to apply a press force to the of electronic assembly components 130 to be connected and arranged between the press yoke 112 and the press plunger 114. The drive can act both on the press yoke 112 and on the press plunger 114 and can be designed for example as a hydraulic press. An upper hard tool 120 is arranged on the underside of the press yoke 112, wherein a graphite foil 140 is provided between the press yoke 112 and the upper hard tool 120 which can achieve a degree of compensation for pressure or gradient between the press yoke 112 and the upper hard tool 120. The graphite foil 140 can be adapted in its type and thickness such that it can achieve, like an elastic foil, a planar alignment between the upper hard tool 120 and a lower tool 122 when a press force is exerted between the upper and lower tools. As a result, an exact parallel alignment of the upper and lower tools is achievable by means of the graphite foil 140.

On the upper side of the press plunger 114 is a heating plate 124 which can also have one or more cooling devices in addition to one or more heating devices. The lower tool 122, which has on its upper surface a receptacle for an elastic pressure pad 90, is arranged on the upper side of the heating plate 124. Alternatively or additionally, a pressure pad designed as a soft tool can be provided in the upper tool 120, such that the upper hard tool 120 and/or the lower tool 122 can be replaced by a press tool 70, as shown in FIG. 8, 9a or 9b.

The components 130 to be connected are arranged on the pressure pad 90. For protection against or damage and/or fouling of the pressure pad 90 and of the upper hard tool 120 and of the lower tool 122, separating foils 132.1, 132.2, which can for example be formed by correspondingly cut metal foils or PTFE films (polytetrafluoroethylene films) and for example have a thickness of approx. 250 µm, are arranged above and below the components 130 respectively. To prevent any inadvertent slipping of the separating foils 132.1, 132.2, a pressure ring 126 pretensioned by means of compression springs 128 can be provided on the upper hard tool 120, which ring contacts an all-round rim section of the lower tool 122 when the press yoke 112 and press plunger 114 are brought together and thereby clamps the separating foils 132.1, 132.2. Alternatively, a separating foil 132 can be dispensed with, in particular when a metal foil 80 according to the design in FIGS. 8, 9a, 9b is used.

Further exemplary diffusion soldering or sintering devices 210 are shown in FIGS. 11a to 11d, their design corresponding in principle to the design of the diffusion soldering or sintering device 110 in FIG. 10, however simplified and shown even less true to scale. In the following, therefore, only the principal differences are explained. In the illustration in FIG. 11a, the press yoke and the press plunger are not shown. An upper hard tool 120 with a two-piece design comprising a first upper hard tool 120.1 and a second upper hard tool 120.2 is arranged on the press yoke. An elastic compensating foil, e.g. a graphite foil, is not provided. The lower tool 122 has like the diffusion soldering or sintering device 110 an embedded pressure pad 90 on which the components 130 to be connected are stored. Above the components 130 is a separating foil 132.1, not shown to scale, and underneath the components 130 a further separating foil 132.2 corresponding to the design of the diffusion soldering or sintering device 110. The thickness of the separating foils 132.1, 132.2 can for example be 250 µm. A pressure ring for fixing the separating foils 132.1, 132.2 is not shown, but can be provided in similar fashion to the diffusion soldering or sintering device 110. Alternatively, the pressure pad 90 can be delimited by a metal foil 80, comparable in FIGS. 8, 9a, 9b, from the components 130.

Figure 11A:
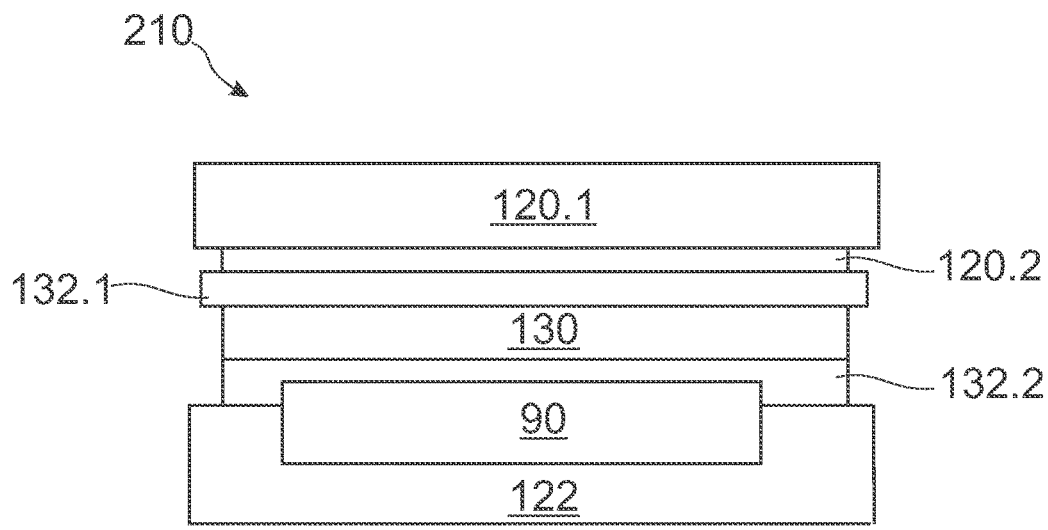
Figure 11B:
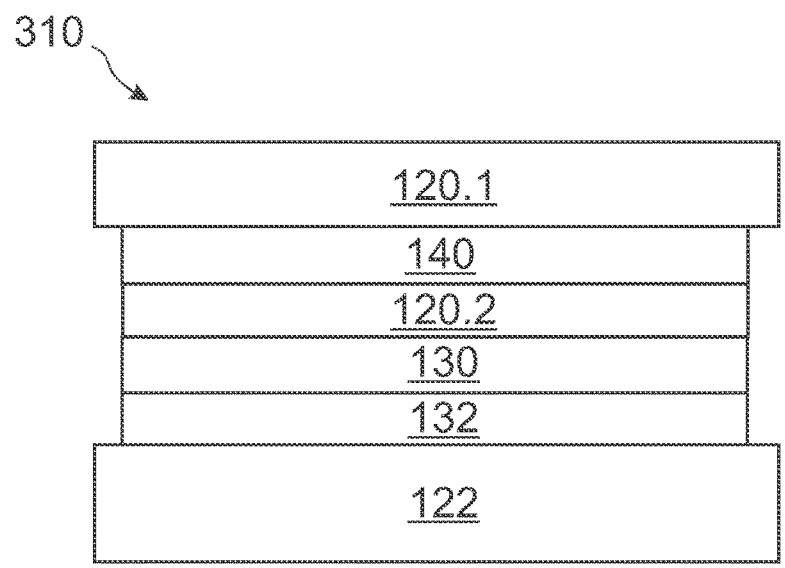

FIG. 11b shows a diffusion soldering or sintering device 310 which in turn represents a modification of the diffusion soldering or sintering devices 110, 210 in FIG. 10 or 11a. The press yoke and the press plunger are not shown. The design of the upper hard tool is two-part, similarly to the diffusion soldering or sintering device 210 in FIG. 11a, and comprises a first upper hard tool 120.1 and a second upper hard tool 120.2 arranged underneath it. Unlike the diffusion soldering or sintering device 210 in FIG. 11a, an elastic foil 140 is arranged between the first upper hard tool 120.1 and the second upper hard tool 120.2 to achieve parallelism between the upper and the lower tool. A further difference is that only a single separating foil 132, which is arranged between the components 130 and the lower tool 122 and whose thickness can for example be 500 µm, is provided.

Figure 11C:
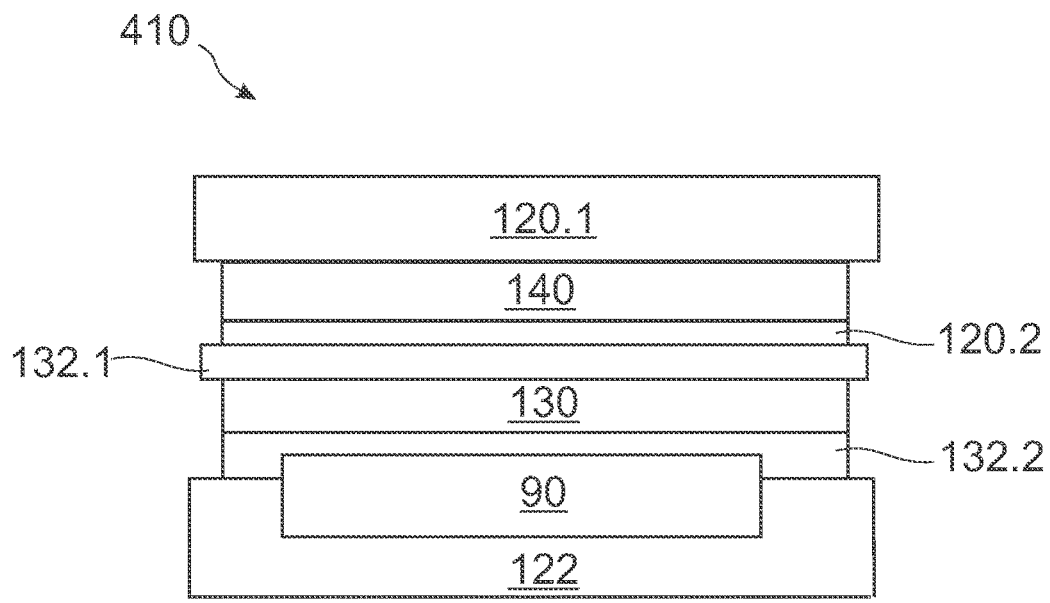

The embodiment of the diffusion soldering or sintering device 410 in FIG. 11c corresponds substantially to the design in FIG. 11a, with the difference that between the first upper hard tool 120.1 and the second upper hard tool 120.2 an elastic foil 140 is arranged to achieve parallelism between the upper and the lower tool. To that extent the embodiment 410 corresponds to a combination of the embodiments 210 and 310.

Figure 11D:
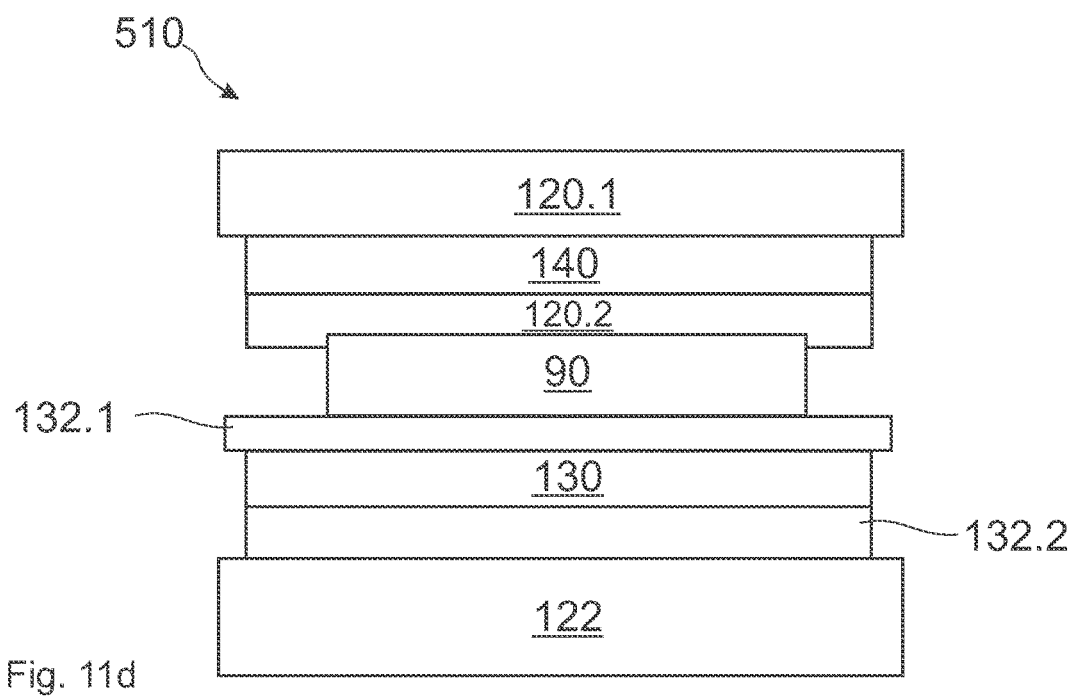

FIG. 11d shows a further embodiment of a diffusion soldering or sintering device 510. This corresponds substantially to the embodiment in FIG. 11c, with the difference that the pressure pad 90 is not arranged in the lower tool 122, but in the upper tool on the underside of the second tool 120.2.

FIGS. 12a to 12c show an embodiment of a diffusion soldering or sintering device 610 in combination with a press tool 70, as shown for example in FIGS. 8 and 9a, 9b. The fold-open process chamber 20 comprises a base body 22 and a cover 24. By means of previously described swivel axes 44, with axes 44.1 and 44.3 being shown, the cover 24 can be fixed on the base body 22 and swiveled, i.e. folded open, to make the interior of the process chamber 20 and the lower and upper tools accessible. Inside the base body 22, a press drive 34 is arranged which can exert via a press plunger 114 a feed movement on a component 130 held in a workpiece carrier, not shown, relative to the press tool 70 arranged in the upper tool. Several parts 142, for example power semiconductor components such as IGBTs or similar, are arranged on the component 130. The parts 142 of the component 130 can have differing heights and should be connected in a diffusion soldering, bonding or sintering process on the component 130, for example with a cooling structure and connection lines. The component 130 can here be covered with a process covering, not shown, for example a foil or similar, for prevention of fouling and for protection. Fluid ducts 156 for temperature regulation, i.e. for routing a heating or cooling fluid such as oil or air, are integrated in the cover 24.

A heating plate 124, which can have identical fluid ducts for heating or cooling, is arranged in the press tool 70. The heating plate 124 is the downward limit of a pressure chamber 90, in which a pressure pad can be placed. The pressure chamber 90 has a chamber area 144 which is controllably fillable with fluid. The fluid can be a gas or a liquid. In this embodiment, it is provided that the chamber area 144 be filled with atmosphere gas of the process chamber 20, for example with a cleaning gas such as nitrogen or with air. To do so, two filler valves 146 are provided in the cover 24 to enable via valve actuators 148 fluid-tight closing or opening of the chamber area 144 of the pressure chamber 90 in relation to the process chamber 20.

The pressure chamber 90 is furthermore limited in the direction of the lower tool with a metal membrane as membrane part 80. The metal membrane can for example be a steel membrane. e.g. a steel sheet formed into a dish shape. The metal membrane can bulge downwards in the direction of the process chamber 20 due to a fluid filling of the chamber area 144.

A multi-plunger unit 150 is arranged underneath the membrane part 80. The multi-plunger unit 150 comprises a guide plate 154 that receives and guides several press plungers 152. The press plungers 152 are used to selectively introduce a press force into predefinable areas of the component 130, and can be adapted in shape and size to the varying geometrical dimensions of the parts 142 into which press force is to be introduced. During a pressure application, i.e. an activation of the press drive 34, the press plungers 152 are moved inside the guide frame 154 in the direction of the component 130 for selectively exerting a press force.

In the sequence shown in FIGS. 12a to 12c, a pressure application should-regardless of a press force generated by the press drive 34—take place by the membrane part 80 bulging out due to a pressure difference between the process chamber 20 and the fluid-fillable chamber areas 144 of the pressure chamber 90. The size of the compressive force is determined from the pressure difference between the chamber area 144 and the process chamber 20, which causes a displacement of the membrane part 80 in the direction of the lower tool and thereby exerts a pressure on the component 130.

In a first process step shown in FIG. 12a, the filler valves 146 are in an upper position, so that the chamber area 144 is fluidically connected to the process chamber 20. In the second process step, a vacuum is created in the process chamber 20, which also leads to a vacuum in the chamber area 144. The first and second process steps are shown in FIG. 12a.

In the subsequent third process step, the process chamber 20 is flooded with a cleaning gas such as nitrogen which penetrates into the chamber area 144 of the fluid chamber 90. In the fourth process step, the filler valves 146 are then separated fluid-tightly from the process chamber 20 by means of the valve actuators 148. After that, the press drive 34 can, in the fifth process step, be activated until a workpiece carrier (not shown) with the component 130 and a positioned process covering (likewise not shown) is in adjacent contact with the multi-plunger unit 154. The steps three to five are shown in FIG. 12b.

In the following sixth process step, shown in FIG. 12c, the process chamber 20 is evacuated. The membrane part 80 here bulges downwards due to the pressure difference between the chamber area 144 of the pressure chamber 90 and the process chamber 20, and moves the press plungers 152 inside the guide frame 154 in the direction of the component 130, so that a compressive force is selectively exerted on the individual parts 142. This allows height differences of the parts 142 to be compensated for, with the press force being finely dosable depending on the pressure difference.

This pressure application resulting from the pressure difference between the process chamber 20 and the pressure chamber 90 can be applied alternatively or additionally to a press force exerted by the press drive 34. The pressures generatable thereby are as a rule lower and more finely dosable than the mechanical compressive force applied by means of the press drive 34. A bonding method, diffusion soldering method or low-pressure sintering method can be effectively supported therewith.

It is evident that different features of the diffusion soldering or sintering devices 110, 210, 310, 410, 510, 610 can be combined with one another to obtain further variants. It is for example possible to replace the first upper hard tool 120.1 with the press yoke 112. Furthermore, the upper separating foil 132.1 can also be dispensed with in the diffusion soldering or sintering device 110 (FIG. 10), similarly to the diffusion soldering or sintering device 310. In accordance with a further modification, the combination of the lower tool 122 and the pressure pad 90 can also be replaced by the press tool 70 (FIGS. 8 and 9). In a further modification, the press tool 70 can alternatively or additionally replace the upper hard tool 120 or 120.2 or the combination of both the upper hard tools 120.1, 120.2. In a further modification, the press yoke 112 can be formed by the swivelable cover 24 (FIGS. 1 to 7). Further embodiments, which for example integrate a pressure pad in the upper tool and in the lower tool, are conceivable. It is also possible that an elastic foil 140 is provided in the lower tool, in the upper tool or in the lower and the upper tool.

LIST OF REFERENCE NUMERALS 10, 110, 210,
310, 410, 510, 610 Diffusion soldering or sintering device
12 Housing
14 Lid
20 Process chamber
22 Base body
23 Access opening
24 Cover
26 Actuating arm
28 Sealing ring
30 Upper tool
32 Lower tool
34 Press drive
36 Joint
38 Workpiece carrier
40 Locking device
42.1-42.3 Locking arm
44.1-44.3 Swivel axis
46.1-46.3 Locking section
48 Extraction chamfer
50.1-50.3 Locking bolt
51 Bolt play
60.1, 60.3 Blocking lever
62 Release lever
64 Coupling rod
66 Locking sensor
70 Press tool
72 Baseplate
74 Wall section
76 Sealing ring
80 Membrane part
84 Clamping ring
90 Pressure chamber/pressure pad
92 Press surface
112 Press yoke
114 Press plunger
120, 120.1, 120.2 Upper hard tool
122 Lower tool
124. Heating plate
126 Pressure ring
128 Compression spring
130 Component
132, 132.1, 132.2 Separating foil
140 Elastic foil/graphite foil
142 Part on component
144 Fillable chamber area of fluid chamber
146 Filler valve
148 Valve actuator
150 Multi-plunger unit
152 Press plunger
154 Guide frame
156 Fluid ducts for temperature regulation

The invention claimed is:

1. Sintering device or diffusion soldering device for connecting components of at least one electronic assembly by means of pressure sintering or diffusion soldering, comprising an evacuatable process chamber in which an upper tool and a lower tool are arranged, between which the assembly is held and which are displaceable relative to one another in their distance apart to exert a press force, wherein the process chamber comprises a base body having on its upper side an access opening and a cover which is adjustable between a closed position in which the access opening is closed by the cover and an open position, wherein the upper tool is supported on the cover in the closed position of the cover at least during the exertion of the press force, characterized in that the process chamber comprises a locking device movable between a locked position and an unlocked position, which in its locked position is configured to fix the cover in its closed position on the base body, wherein the locking device has several swivelable locking arms which in the locked position are positively connected both to the cover and to the base body, wherein each of the locking arms is fastened with its first end to the cover swivelably about a respective swivel axis and is mounted on the cover so as to oscillate due to gravity, and has at its second end a respective locking section on which inlet bevels are formed, so that in the locked position the locking section is locked with a respective locking bolt assigned to the locking arm and fastened to the base body.

2. Sintering device or diffusion soldering device according to claim 1, characterized in that the cover is swivelably jointed to the base body about a tilting axis, wherein preferably an actuating arm configured to swivel the cover is fastened to the cover.

3. Sintering device or diffusion soldering device according to claim 1, characterized in that the access opening, the cover in its locked position and the swivel axes of the locking arms extend in a respective horizontal plane.

4. Sintering device or diffusion soldering device according to claim 1, characterized in that the locking arms are arranged on two side surfaces of the cover opposite one another.

5. Sintering device or diffusion soldering device according to claim 4, characterized in that the locking device has precisely three locking arms, wherein a first and a second locking arm are arranged on the one side surface and a third locking arm on the other side surface.

6. Sintering device or diffusion soldering device according to claim 5, characterized in that the swivel axes of the locking arms and the locking bolts associated with these locking arms are arranged such that the effective direction of a locking force, which is transmitted due to the exertion of the press force between the cover and the base body via a respective locked locking arm, extends at least for the first and the second locking arms parallel to the effective direction of the press force and preferably extends for the third locking arm obliquely to the effective direction of the press force.

7. Sintering device or diffusion soldering device according to claim 5 characterized in that the first and the second locking arm are connected via a coupling rod such that the first and the second locking arm are synchronously movable between the locked position and the unlocked position.

8. Sintering device or diffusion soldering device according to claim 5 characterized in that a distribution of mass of the third locking arm and the positions of the swivel axis of the third locking arm and of the locking bolt associated with the third locking arm is asymmetrical with respect to an imaginary plane of symmetry, which is spanned between the swivel axis and an axis of symmetry of the locking bolt extending parallel to the swivel axis when the locking arm is locked, so that the third locking arm is held in its locked position solely by the effect of gravity when the cover is closed and in the absence of additional forces.

9. Sintering device or diffusion soldering device according to claim 1 characterized in that at least one blocking lever preferably designed as a toggle lever and interacting with a respective associated locking arm is provided which is movable between a blocking position in which the blocking lever blocks the locking arm in its locked position against a movement and a release position in which the blocking lever releases the locking arm for a movement, and/or in that at least one release lever preferably designed as a toggle lever and interacting with a respective associated locking arm is provided which is configured to move the locking arm from its locked position to its unlocked position.

10. Sintering device or diffusion soldering device according to claim 1, comprising a press yoke on which the upper tool is arranged, wherein an elastic foil, preferably a graphite foil, is arranged between the press yoke and the upper tool and/or in the lower tool.

11. Sintering device or diffusion soldering device according to claim 10, characterized in that the lower tool has a fluid-filled pressure pad on a side facing the assembly.

12. Sintering device or diffusion soldering device according to claim 1, further comprising a press tool for the upper tool or the lower tool, that has a rigid baseplate, a membrane part connected to the baseplate in the direction of the press surface and formed by a flexible, preferably dish-shaped membrane preferably made from silicone or a steel alloy, and containing a pressure chamber preferably comprising a pressure pad filled with a fluid and arranged in a closed receiving area limited by the baseplate and the membrane part.

13. Sintering device or diffusion soldering device according to claim 12, characterized in that the membrane part has an all-round rim section clamped between the baseplate and a clamping ring connected, preferably bolted, to the baseplate.

14. Sintering device or diffusion soldering device according to claim 12, characterized in that at least one sub-area of the pressure chamber, in particular of the pressure pad, is controllably fluid-fillable, in particular gas-fillable, preferably by means of at least one filler valve.

15. Sintering device or diffusion soldering device according to claim 12, characterized in that a multi-plunger unit with a plurality of press plungers guided in a guide frame is arranged underneath the membrane part.

* * * * *